(12) United States Patent
Herrmann et al.

(10) Patent No.: US 10,672,962 B2
(45) Date of Patent: Jun. 2, 2020

(54) LIGHT-EMITTING SEMICONDUCTOR CHIP, LIGHT-EMITTING COMPONENT AND METHOD FOR PRODUCING A LIGHT-EMITTING COMPONENT

(71) Applicant: OSRAM OLED GMBH, Regensburg (DE)

(72) Inventors: Siegfried Herrmann, Neukirchen (DE); Michael Völkl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/091,080

(22) PCT Filed: Apr. 10, 2017

(86) PCT No.: PCT/EP2017/058540
§ 371 (c)(1),
(2) Date: Oct. 3, 2018

(87) PCT Pub. No.: WO2017/178424
PCT Pub. Date: Oct. 19, 2017

(65) Prior Publication Data
US 2019/0115510 A1    Apr. 18, 2019

(30) Foreign Application Priority Data
Apr. 11, 2016  (DE) .................. 10 2016 106 570

(51) Int. Cl.
*H01L 33/62* (2010.01)
*H01L 33/38* (2010.01)
(Continued)

(52) U.S. Cl.
CPC .............. *H01L 33/62* (2013.01); *H01L 27/15* (2013.01); *H01L 33/007* (2013.01);
(Continued)

(58) Field of Classification Search
CPC ........ H01L 33/62; H01L 33/385; H01L 27/15
See application file for complete search history.

(56) References Cited

U.S. PATENT DOCUMENTS

| 6,281,524 B1 | 8/2001 | Yamamoto et al. |
| 6,376,902 B1 * | 4/2002 | Arndt .................... H01L 33/486 257/100 |

(Continued)

FOREIGN PATENT DOCUMENTS

| DE | 102013103226 A1 | 10/2014 |
| DE | 102015104886 A1 | 10/2016 |

(Continued)

OTHER PUBLICATIONS

Monroy, E. et al., "Growth Kinetics of N-Face Polarity GaN by Plasma-Assisted Molecular-Beam Epitaxy," Applied Physics Letters, vol. 84, No. 18, May 3, 2004, 3 pages.

(Continued)

*Primary Examiner* — Selim U Ahmed
*Assistant Examiner* — Evan G Clinton
(74) *Attorney, Agent, or Firm* — Slater Matsil, LLP

(57) ABSTRACT

A light-emitting semiconductor chip, a light-emitting component and a method for producing a light-emitting component are disclosed. In an embodiment a light-emitting semiconductor chip includes a substrate having a top surface, a bottom surface opposite the top surface and a first side surface extending transversely or perpendicularly to the bottom surface, a semiconductor body arranged on the top surface of the substrate, the semiconductor body comprising an active region configured to generate light and a contacting comprising a first current distribution structure and a second current distribution structure, which is formed to supply current to the active region, wherein the semiconductor chip is free of any connection point on a side of the semiconductor body facing away from the substrate and on (Continued)

the bottom surface of the substrate, and wherein the connection point is a connection point for electrically contacting the first and second current distribution structures.

23 Claims, 27 Drawing Sheets

(51) Int. Cl.
| | |
|---|---|
| H01L 33/48 | (2010.01) |
| H01L 27/15 | (2006.01) |
| H01L 33/00 | (2010.01) |
| H01L 33/22 | (2010.01) |
| H01L 33/32 | (2010.01) |
| H01L 33/44 | (2010.01) |
| H01L 33/50 | (2010.01) |
| H01L 33/56 | (2010.01) |
| H01L 33/60 | (2010.01) |
| H01L 25/075 | (2006.01) |

(52) U.S. Cl.
CPC .......... *H01L 33/0079* (2013.01); *H01L 33/22* (2013.01); *H01L 33/32* (2013.01); *H01L 33/385* (2013.01); *H01L 33/44* (2013.01); *H01L 33/48* (2013.01); *H01L 33/502* (2013.01); *H01L 33/56* (2013.01); *H01L 33/60* (2013.01); *H01L 25/0753* (2013.01); *H01L 33/0095* (2013.01); *H01L 2933/0033* (2013.01); *H01L 2933/0066* (2013.01); *H01L 2933/0091* (2013.01)

(56) References Cited

U.S. PATENT DOCUMENTS

| | | | |
|---|---|---|---|
| 7,195,942 | B2 | 3/2007 | Eisert et al. |
| 2008/0093607 | A1 | 4/2008 | Feng et al. |
| 2009/0121241 | A1 | 5/2009 | Keller et al. |
| 2010/0171135 | A1 | 7/2010 | Engl et al. |
| 2015/0349231 | A1* | 12/2015 | Hsieh .................. H01L 33/642 |
| | | | 257/98 |
| 2016/0056344 | A1 | 2/2016 | Reill et al. |
| 2017/0018695 | A1* | 1/2017 | Herrmann .......... H01L 33/0095 |
| 2018/0102466 | A1 | 4/2018 | Herrmann |

FOREIGN PATENT DOCUMENTS

| | | |
|---|---|---|
| EP | 1256134 B1 | 5/2015 |
| WO | 2015124464 A1 | 8/2015 |

OTHER PUBLICATIONS

Okada, N. et al., "Alternately Double-Sided Growth of Low-Curvature GaN Templates on Sapphire Substrates using Hydride Vapor Phase Epitaxy," Basic Solid State Physics, 253, No. 5, Mar. 4, 2016, 1 page.

Okumura, H. et al., "Growth Diagram of N-Faced GaN (0001) Grown at High Rate by Plasma-Assisted Molecular Beam Epitaxy," Applied Physics Letters, 104, 012111-012111-5, Jan. 8, 2014, 5 pages.

\* cited by examiner

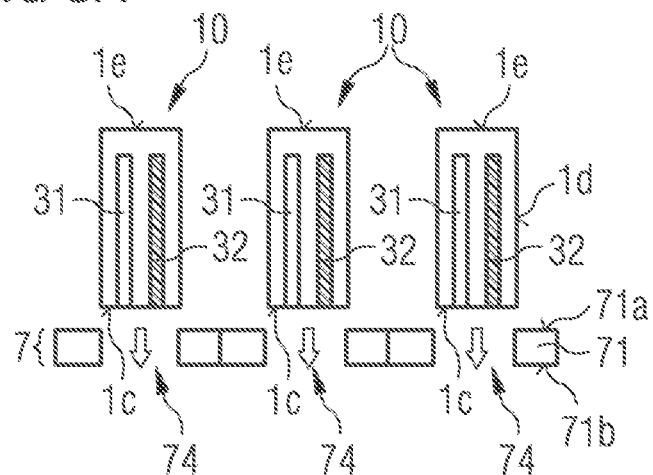
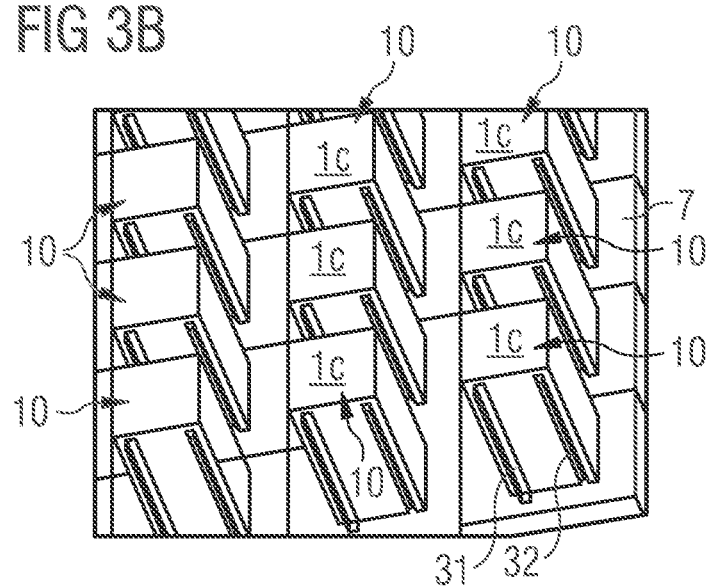
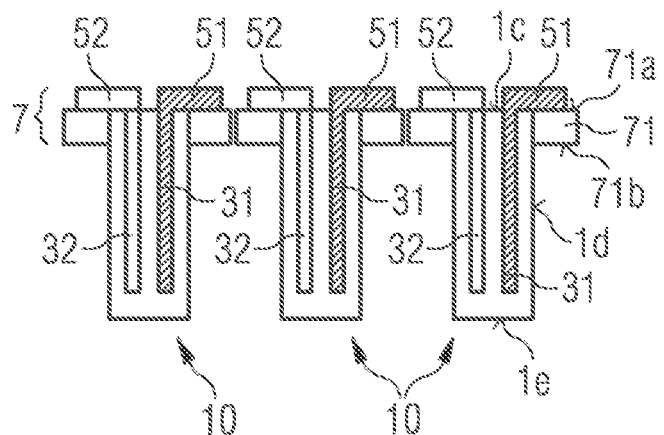

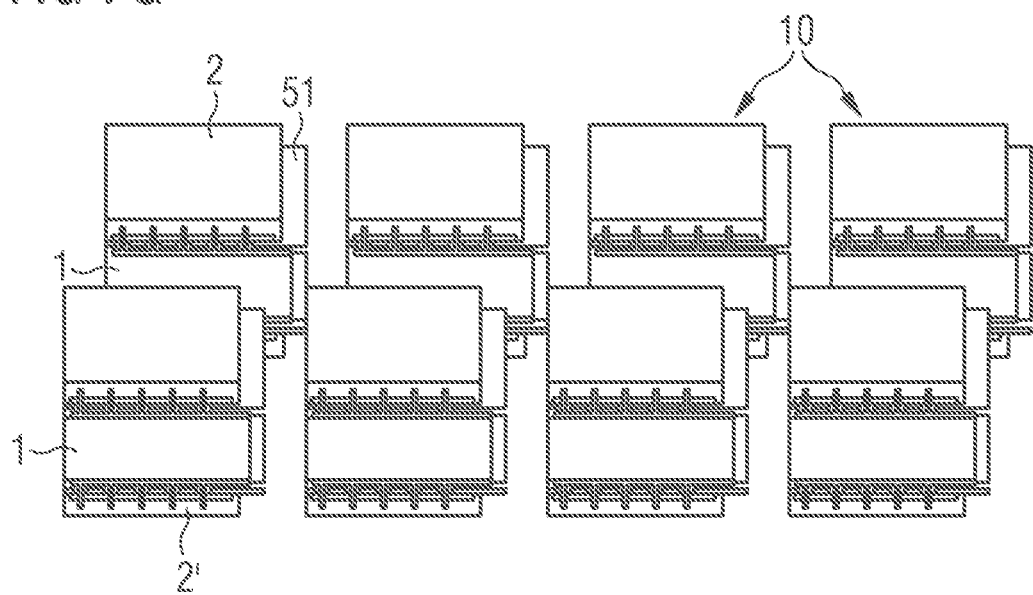

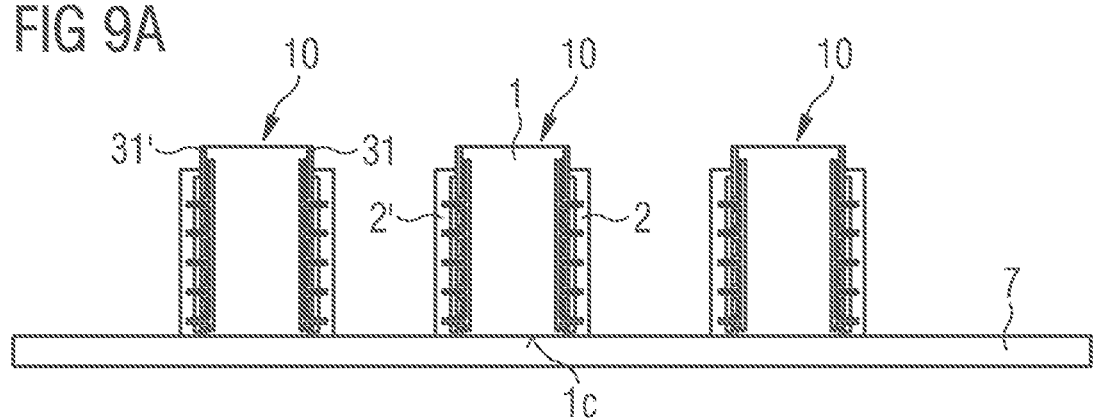
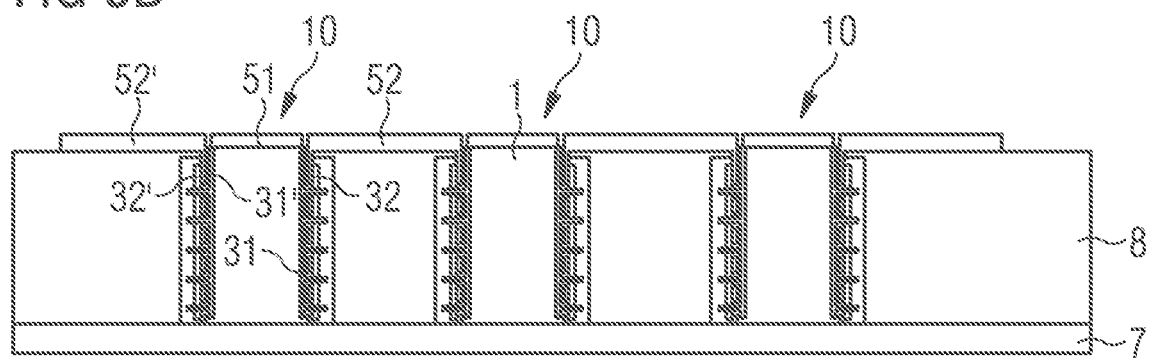
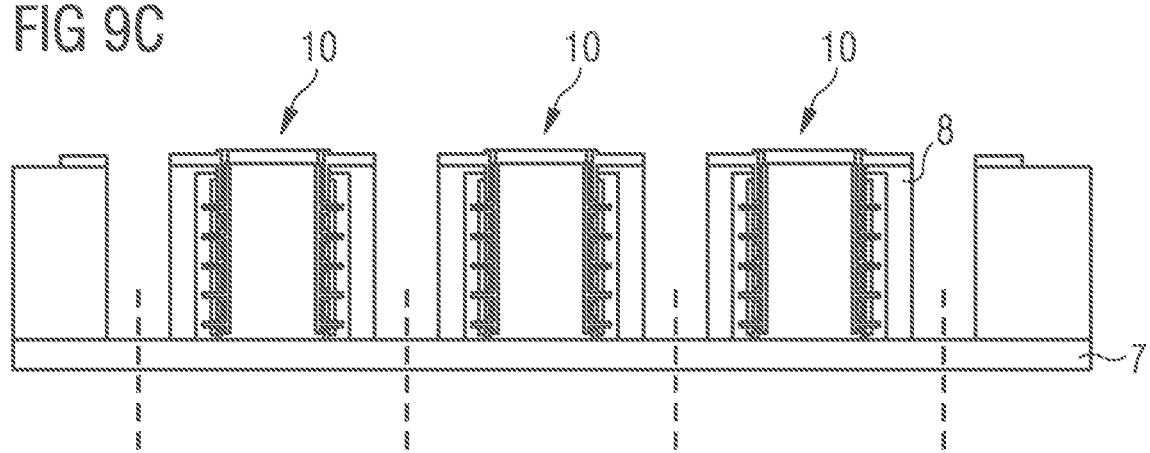

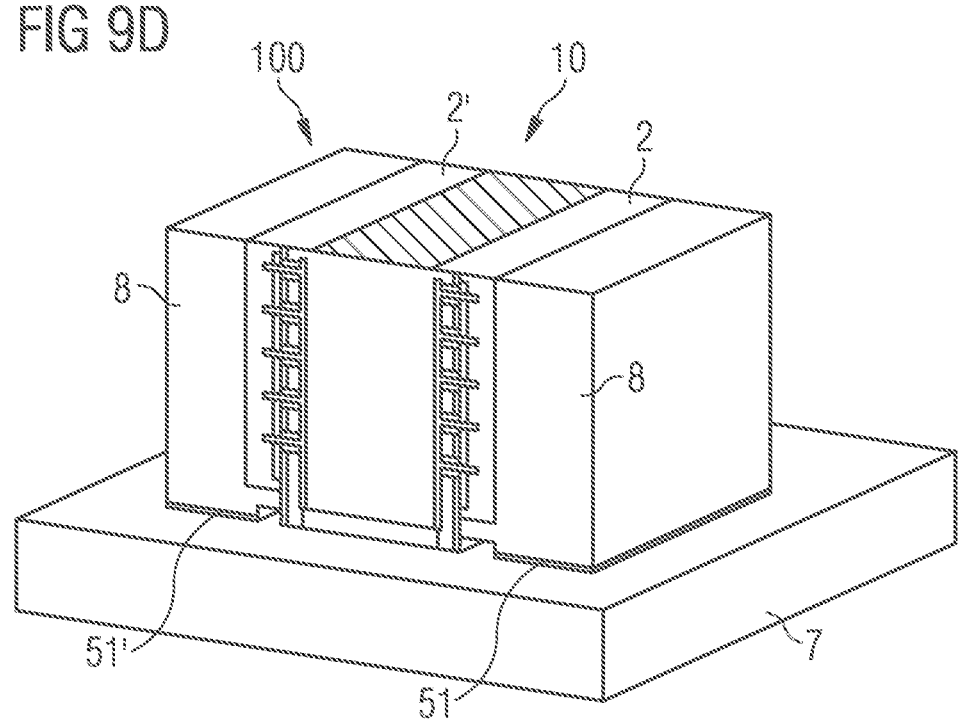
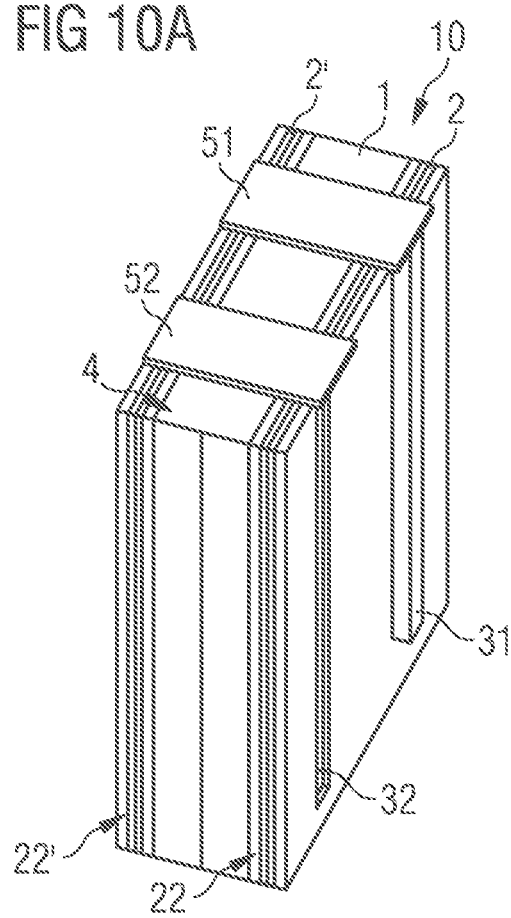

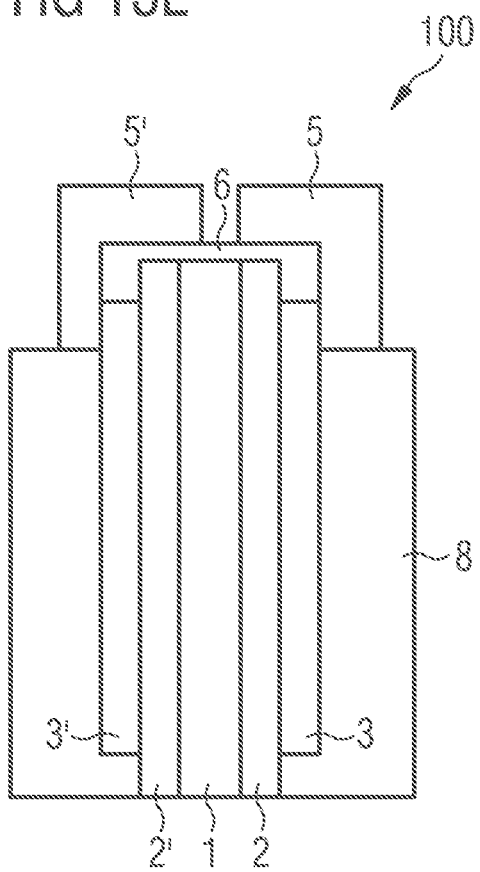

LIGHT-EMITTING SEMICONDUCTOR CHIP, LIGHT-EMITTING COMPONENT AND METHOD FOR PRODUCING A LIGHT-EMITTING COMPONENT

This patent application is a national phase filing under section 371 of PCT/EP2017/058540, filed Apr. 10, 2017, which claims the priority of German patent application 10 2016 106 570.6, filed Apr. 11, 2016, each of which is incorporated herein by reference in its entirety.

TECHNICAL FIELD

A light-emitting semiconductor chip and a light-emitting component are provided. Further, a method for producing a light-emitting component is provided.

BACKGROUND

European Patent No. EP 1256134 B1 describes a light-emitting semiconductor chip.

SUMMARY OF THE INVENTION

Embodiments provide a light-emitting semiconductor chip, in which a particularly large proportion of the outer surface 1s available for emitting light. Further embodiments provide a light-emitting component, which is particularly easy to produce. Yet other embodiments provide a method for producing a light-emitting component that is particularly cost-effective to produce.

In an embodiment a light-emitting semiconductor chip is provided. For example, the semiconductor chip is a luminescent diode chip such as a laser diode chip or a light emitting diode chip. In particular, the light-emitting semiconductor chip can be an LED chip. The light-emitting semiconductor chip generates light during operation, i.e., electromagnetic radiation in the spectral range of infrared radiation to UV radiation, in particular in the spectral range of visible light.

According to at least one embodiment of the light-emitting semiconductor chip, the semiconductor chip comprises a substrate. The substrate may in particular be a growth substrate for a semiconductor body of the light-emitting semiconductor chip. Furthermore, the substrate may be a carrier, which is different from the growth substrate. In particular, it is possible for the substrate to be formed with sapphire and/or silicon or to consist of sapphire and/or silicon. The substrate may be formed to be light-transmissive. In this case, the substrate is transmissive or transparent, for example, for light generated in the semiconductor chip during operation.

The substrate comprises a top surface, which is formed, for example, by a main surface of the substrate. Furthermore, the substrate comprises a bottom surface opposite the top surface, which may also be formed by a further main surface of the substrate. Furthermore, the substrate comprises a first side surface, which extends transversely or perpendicularly to the bottom surface. The first side surface may in particular also extend transversely or perpendicularly to the top surface.

According to at least one embodiment of the light-emitting semiconductor chip, the light-emitting semiconductor chip comprises a semiconductor body on the top surface of the substrate. The semiconductor body is, for example, deposited epitaxially on the substrate on the top surface of the substrate or is or attached to the substrate at the top surface of the substrate. The semiconductor body may be formed, for example, with a III-V compound semiconductor material, in particular, the semiconductor body may be formed with a nitride compound semiconductor material. The semiconductor body comprises an active region, which is formed for generating light. That is to say that during operation of the light-emitting semiconductor chip the active region is supplied with current, which leads to the generation of light, which leaves the light-emitting semiconductor chip at least partially.

According to at least one embodiment of the light-emitting semiconductor chip, the light-emitting semiconductor chip comprises a contacting, which is formed to supply the active region with current. By means of the contacting, current is injected into the semiconductor body of the light-emitting semiconductor chip and distributed in the semiconductor body of the light-emitting semiconductor chip, so that the active region may be supplied with current as evenly as possible over its entire surface. The contacting comprises a first current distribution structure and a second current distribution structure. For example, the first current distribution structure is formed for supplying current to the active region on the p-side. The second current distribution structure is then formed for supplying current to the active region on the n-side.

According to at least one embodiment of the light-emitting semiconductor chip, the semiconductor chip on the side of the semiconductor body facing away from the substrate and the semiconductor chip on the bottom surface of the substrate is free of any connection point, which is formed for electrically contacting the current distribution structures. That is to say that the light-emitting semiconductor chip does not have any connection points either on its top surface or on its bottom surface, which are intended, for example, for wire contact, for solder contact or for contact by means of a conductive adhesive. In particular, it is possible that the bottom surface of the substrate is also free of electrically conductive structures. That is to say that neither connection areas such as a bonding pad are arranged on the top surface of the semiconductor body facing away from the substrate, nor are connection points for making electrical contact with the semiconductor body arranged on the bottom surface of the substrate.

The current distribution structures may follow predetermined straight lines or lines on the top surface of the semiconductor body facing away from the substrate, wherein the current distribution structures have a uniform thickness along these straight lines or lines and, for example, have no wider region, which may be used as a bonding pad or the like.

According to at least one embodiment of the light-emitting semiconductor chip, a light-emitting semiconductor chip is provided having a substrate comprising a top surface, a bottom surface opposite the top surface and a first side surface extending transversely or perpendicularly to the bottom surface, a semiconductor body on the top surface of the substrate, which comprises an active region formed for generating light, and a contacting comprising a first current distribution structure and a second current distribution structure, which is formed to supply current to the active region, wherein the semiconductor chip on the side of the semiconductor body facing away from the substrate and the semiconductor chip on the bottom surface of the substrate is free of any connection point, which is formed for electrically contacting the first and second current distribution structures.

A light-emitting semiconductor chip described here is based, among other things, on the following consideration: With conventional light-emitting semiconductor chips, connecting points, which are provided for electrical contacting of the current distribution structures of the light-emitting semiconductor chip, occupy a part of the top surface of the semiconductor body facing away from the substrate. Since these connection points are typically metallic, no light can pass through them during the operation of the semiconductor chip. It is thereby possible that the light-emitting surface of the semiconductor chip is reduced. In the same manner, connection points on the bottom surface of the substrate facing away from the semiconductor body lead to a reduced light generation, since plated-through holes through the active region must be available for such connection points, which reduce the area via which light is generated in the light-emitting semiconductor chip.

In the light-emitting semiconductor chip described here, there are therefore no such connection points on the side of the semiconductor body facing away from the substrate and on the bottom surface of the substrate, which leads to an increase in the area available for light emission. With a light-emitting semiconductor chip described here, for example, it is possible that at least 90%, in particular at least 95%, of the entire outer surface of the chip is available for direct light emission. That is to say, light can pass through at least 90% of the outer surface of the chip without being prevented from being emitted by, for example, a connection point.

According to at least one embodiment of the semiconductor light-emitting chip, the first current distribution structure and the second current distribution structure are freely accessible from a side facing away from the substrate of the semiconductor body. That is to say, the first current distribution structure and the second current distribution structure are freely accessible on a top surface of the semiconductor body and may be electrically contacted there, for example. The current distribution structures extend, for example, in places over the top surface of the semiconductor body facing away from the substrate. The first current distribution structure may be arranged on the top surface without protruding into the semiconductor body. The second current distribution structure may then be arranged in a trench, which is formed in the semiconductor body and, for example, be in direct contact with an n-conducting semiconductor region of the semiconductor body. The trench, in which the second current distribution structure is located, then penetrates the active region.

For example, the first and second current distribution structures may be a conductor track with a uniform width within the manufacturing tolerance. The current distribution structures may, for example, extend parallel to a longitudinal axis of the top surface of the semiconductor body facing away from the substrate. For example, the current distribution structures may extend to an edge of the semiconductor body, where the semiconductor body is adjacent to the first side surface. On the opposite side surface, there may be a distance between the current distribution structures and the associated edge of the semiconductor body. All current distribution structures extend in particular to the same edge. Furthermore, it is possible that the current distribution structures have a distance of at least 10 µm, in particular of at least 25 µm, from each edge of the semiconductor body.

In particular, it is possible that the current distribution structures are the only freely accessible electrically conductive components on the top surface of the semiconductor body facing away from the substrate and that the bottom surface of the substrate is also free of electrically conductive structures.

According to at least one embodiment of the light-emitting semiconductor chip, the current distribution structures extend at least in sections along a main extension direction of the semiconductor body and each have a length of at least 75%, in particular of at least 90% of the length of the semiconductor body along the main extension direction.

According to at least one embodiment of the light-emitting semiconductor chip, the light-emitting semiconductor chip is free of any connection point which is formed for electrical contacting of the current distribution structures. That is to say, in this case it is possible that the light-emitting semiconductor chip only comprises the current distribution structures as components for contacting the active region and no further connection points, such as bond pads, which are electrically conductively connected to the current distribution structures.

According to at least one embodiment of the light-emitting semiconductor chip, the first side surface of the substrate is formed as a mounting surface of the semiconductor chip. That is to say, in this case the mounting surface of the semiconductor chip extends perpendicular to the main extension plane of the semiconductor body, so that the mounting plane of the semiconductor chip is perpendicular to the main extension plane of the semiconductor body. Due to the fact that the light-emitting semiconductor chip has a light-transmissive substrate, it is then possible that all surfaces of the semiconductor chip, for example, the bottom surface of the substrate, all side surfaces of the substrate and the top surface of the semiconductor body facing away from the top surface of the substrate, are provided and formed to emit light, except for the first side surface, which is formed as the mounting surface of the semiconductor chip. The light-emitting semiconductor chip described here thus forms a volume emitter, in which the epitaxially produced layers of the semiconductor body extend perpendicular to the mounting surface of the light-emitting semiconductor chip.

According to at least one embodiment of the light-emitting semiconductor chip, a connection is arranged on the first side surface of the substrate, which is formed as a mounting surface of the semiconductor chip. The connection comprises a first connection element electrically conductively connected to the first current distribution structure and a second connection element electrically conductively connected to the second current distribution structure. In other words, connection elements for the electrical connection of the light-emitting semiconductor chip are formed on the first side surface, which also represent at least part of a mounting surface of the semiconductor chip. In this way, for example, the light-emitting semiconductor chip may be surface-mountable on the first side surface.

The current distribution structures and connection elements may be formed of metal or metal alloy.

According to at least one embodiment of the light-emitting semiconductor chip, the light-emitting semiconductor chip comprises a further semiconductor body, which comprises a further active region formed for light generation. The further active region may be formed to generate light or electromagnetic radiation. For example, light or electromagnetic radiation is generated in the further active region, which has a same or a different wavelength range as in the active region.

The further semiconductor body comprising the further active region may be arranged in particular on the bottom surface of the substrate. This is to say, the further semiconductor body is arranged on a side of the substrate, which faces away from the semiconductor body. The further semiconductor body may be attached directly to the bottom surface of the substrate or applied to it, for example, by epitaxial deposition. In addition, it is possible that a further component of the light-emitting semiconductor chip, such as a further substrate, is arranged between the substrate and the further semiconductor body. The substrate and the further substrate may then be attached to each other using a joining technique such as soldering, gluing or direct bonding. "Direct bonding" is a wafer bonding process without additional intermediate layers. The bonding process is based on chemical bonds between two surfaces of two wafers or substrates. For this purpose, the interconnected surfaces should be sufficiently clean, flat and smooth.

Furthermore, in this embodiment, the light-emitting semiconductor chip in comprises a further contacting, which comprises a further first current distribution structure and a further second current distribution structure, and which is formed to supply current to the further active region.

The embodiments for semiconductor body and for contacting apply accordingly to the further semiconductor body and the further contacting.

The light-emitting semiconductor chip is based, inter alia, on the following considerations: Light-emitting components often contain flat, rectangular light-emitting semiconductor chips. On the top side of such a light-emitting semiconductor chip is a semiconductor body with an active region. The semiconductor chip and the active region of the semiconductor chip are oriented with their main extension planes parallel to the surface of a carrier, to which the semiconductor chip is attached. This means that light can only be emitted by the light-emitting semiconductor chip into the half-space above the semiconductor chip.

A light-emitting semiconductor chip described here is based, inter alia, on the idea, of arranging an active region on the top side and bottom side of a substrate, for example, a light-transmissive sapphire substrate. Such a light-emitting semiconductor chip can be mounted vertically, i.e., the main extension plane of the active region and/or the main extension plane of the further active region extend obliquely or perpendicularly to the main extension plane of the carrier, on which the semiconductor chip is applied.

With such a semiconductor chip, the light-generating area per semiconductor chip is at least doubled. This increases the brightness by up to a factor 2. Furthermore, by mounting the chip vertically, the chip can be mounted with a side face, for example, an end face, facing the carrier, resulting in a reduced contact surface of the chip. This greatly reduces the mounting area required by the chip in the component. Furthermore, the improved aspect ratio of base area to direct radiating area results in an increased coupling-out efficiency for such a semiconductor chip. Further, it is possible to form the active regions differently, so that different emission wavelengths occur on both chip sides. This can be used, for example, to close the so-called "cyan gap" and thus improve the color rendering of the light generated by the semiconductor chip during operation.

In addition or alternatively, it is possible to arrange different phosphors downstream of the two different active regions. In this way, for example, warm white light can be generated on a first side of the semiconductor chip, whereas cold white light is generated on a second side of the semiconductor chip.

The optoelectronic semiconductor chip can also be formed, such that the active region and the further active region can be operated simultaneously or independently of each other. If the active region and the further active region are operated simultaneously, it is possible, for example, to connect the two active areas in parallel or in series. In this way it is possible to set the operating voltage of the semiconductor chip.

If the two active regions are electrically connected directly to one another, for example, in series or in parallel, only a single assembly process is necessary for the electrical connection of the semiconductor chip at the destination. In particular, a single wire bonding process is required to connect the semiconductor chip.

An optoelectronic semiconductor chip described here may also be suitable for surface mounting, i.e., it may be an SMT-capable component. Furthermore, the semiconductor chip is particularly compact and is suitable for the production of so-called chip-size packages, in which the volume of the component with package body is only slightly larger than the volume of the semiconductor chip.

According to at least one embodiment of the light-emitting semiconductor chip, the contacting is arranged below the outer surface of the semiconductor body facing away from the substrate, and/or the further contacting is arranged below the outer surface of the further semiconductor body facing away from the substrate. That is to say, it is possible that at least the surface of one of the semiconductor bodies facing away from the substrate is free of the current distribution structures of the contacting or further contacting. The current distribution structures of the contacting or of the further contacting are then arranged between the top surface of the respective semiconductor body and the substrate. In this way, it is possible for the main emission surface of the semiconductor body and/or of the further semiconductor body is in each case free of any is free of any connection or contacting structure. This avoids unwanted reflections and shielding on the light emission surface, further increasing the light emission efficiency of the semiconductor chip.

The current distribution structures of the contacting and/or the further contacting may, for example, be arranged below the outer surface of the semiconductor body as described in document US 2010/0171135 A1. The disclosure content of this publication is hereby explicitly included by reference.

According to at least one embodiment of the light-emitting semiconductor chip, the further first current distribution structure and the further second current distribution structure are freely accessible from a side of the further semiconductor body, which faces away from the substrate. The current distribution structures may be formed and arranged as described for the current distribution structures of the semiconductor body.

According to at least one embodiment of the light-emitting semiconductor chip, the substrate comprises a second side surface, which is arranged transversely or perpendicularly to the first side surface, wherein the second side surface has a larger surface area than the first side surface. That is to say, the substrate is in particular not formed as a cube or cube-like, but the substrate has a smaller side surface, the first side surface, and a larger side surface, the second side surface. The first side surface 1s therefore an end face of the substrate. For example, the longest edge of the substrate, which delimits the first side surface, to the longest edge of the substrate, which delimits the second side surface, has at least the ratio 1:2, for example, the ratio 1:3 or 1:4. That is to say, the substrate is formed, for example, as a square column, wherein the end face of the square column is formed by the first side face, which may be formed as a mounting surface of the semiconductor chip.

The second side surface then preferably has a surface area, which is at least twice as large as the surface area of the first side surface. In the case of such a light-emitting semiconductor chip, the mounting surface on which no light is emitted is small compared to the other surfaces of the semiconductor chip on which light can be emitted. In this way it is possible that more than at least 90%, in particular more than at least 95%, of the entire outer surface of the light-emitting semiconductor chip is emitted. This allows a particularly efficient light-emitting semiconductor chip.

In particular, in such a light-emitting semiconductor chip, the emission surface, i.e., the outer surface through which light can escape during operation, is many times larger than the mounting surface, i.e., the first side surface. For example, the emission area is at least nine times as large as the mounting area.

According to at least one embodiment of the light-emitting semiconductor chip, a mirror is arranged on the first side surface, which may be formed as a mounting surface of the semiconductor chip. The mirror may be, for example, a metallic mirror, which is encapsulated by an electrically insulating material, for example, a dielectric such as silicon dioxide or silicon nitride. Furthermore, the mirror may be formed as a Bragg mirror or as a dielectric mirror.

If present, the connection elements may be guided through the mirror and the optionally present encapsulation of the mirror or laterally across the mirror. In any case, it is possible that the mirror is located between the first side surface of the substrate and the first and the second connection element. The mirror can further increase the efficiency of the light-emitting semiconductor chip by reflecting light emitted in the direction of the first side surface back from the mirror into the substrate, where it can emerge from another side surface of the substrate or through the semiconductor body.

It is additionally possible for a mirror, which is formed in the same manner as the mirror on the first side surface, for example, is arranged on a side surface of the substrate opposite the first side surface. In such a case, the two, for example, relatively small side faces of the substrate are mirrored, so that the light is only emitted through the relatively large main surfaces of the substrate and through the semiconductor body. In this case, it is possible that the mirrors on the opposite side surfaces of the substrate are each Bragg mirrors, which are optimized with regard to their structure, i.e., with regard to the refractive index and the thicknesses of the layers that form the Bragg mirror, to the wavelength of the light generated in the active region.

Furthermore a light-emitting component is provided. The light-emitting component can in particular comprise a light-emitting semiconductor chip described here. This means that all the features disclosed for the light-emitting semiconductor chip are also disclosed for the light-emitting component and vice versa.

According to at least one embodiment of the light-emitting component, the light-emitting component comprises a carrier, which comprises a carrier body with a top surface and a bottom surface opposite the top surface. The carrier is the mechanically supporting and supporting component of the light-emitting component, which is formed to mechanically support and support the light-emitting semiconductor chips. For this purpose, the carrier may be formed, for example, with one of the following materials or consist of one of the following materials: metal, glass, semiconductor material, ceramic, plastic. In particular, it is possible that the carrier is formed with a plastic and is manufactured by casting, injection moulding or injection moulding.

The carrier may be formed to be light-transmissive, light-absorbing or light-reflecting at least in places.

According to at least one embodiment of the light-emitting component, the light-emitting component comprises a light-emitting semiconductor chip described here. In this case, it is also possible for the light-emitting component to comprise two or more of the light-emitting semiconductor chips described here.

According to at least one embodiment, the carrier body of the carrier comprises an opening, which completely penetrates the carrier body from its top surface to its bottom surface. That is to say, the carrier body has a hole in the region of the opening, said hole completely penetrating the carrier body.

According to at least one embodiment of the light-emitting component, the opening in the carrier body is formed to receive the light-emitting semiconductor chip, and the light-emitting semiconductor chip is inserted into the opening. This means that the opening is formed to be so large that the light-emitting semiconductor chip can project at least in places into the carrier body in the opening, so that a part of the light-emitting semiconductor chip is located between the bottom surface and the top surface of the carrier body.

According to at least one embodiment of the light-emitting semiconductor chip, the first side surface of the substrate of the light-emitting semiconductor chip projects beyond the bottom surface of the carrier body or is flush with the bottom surface of the carrier body or the bottom surface of the carrier body projects beyond the first side surface of the substrate of the light-emitting semiconductor chip, and a third side surface of the substrate, which is arranged opposite the first side surface of the substrate of the light-emitting semiconductor chip, projects beyond the carrier body on its top surface. In other words, the first side surface of the light-emitting semiconductor chip is inserted into the opening of the carrier body.

The opening has an extension in the lateral directions, which are the directions parallel to the main extension plane of the carrier body, which makes it possible to receive the light-emitting semiconductor chip on its first side surface. For example, the contour of the opening corresponds to the contour of the first side surface. The opening may have a cross-sectional area slightly larger than the area of the first side surface of the substrate in the main extension plane of the substrate, so that the light-emitting semiconductor chip may be inserted into the opening with a backlash. Furthermore, it is possible for the opening on the top surface of the carrier body to be formed larger than the opening on the bottom surface of the carrier, so that the light-emitting semiconductor chip cannot slip through the carrier. In this way, for example, a press fit between the light-emitting semiconductor chip and the carrier may take place in the carrier body.

According to at least one embodiment of the light-emitting component, a light-emitting component is provided having a carrier, which has a carrier body having a top surface and a bottom surface opposite the top surface (71*a*), and a light-emitting semiconductor chip according to one of the preceding claims, wherein the carrier body comprises an opening, which penetrates the carrier body from its top surface to its bottom surface, the opening is formed to receive the light-emitting semiconductor chip, the light-emitting semiconductor chip is inserted into the opening, the first side surface of the substrate of the light-emitting semiconductor chip projects beyond the bottom surface of the carrier body or is flush with the bottom surface of the carrier body or the bottom surface of the carrier body projects beyond the first side surface of the substrate of the light-emitting semiconductor chip, and a third side surface of the substrate, which is arranged opposite the first side surface of the substrate of the light-emitting semiconductor chip, projects beyond the carrier body on its top surface.

In the light-emitting component described here, the light-emitting semiconductor chip described here partially projects into the carrier and is sunk therein. It is possible that the light-emitting semiconductor chip is flush with the bottom surface of the carrier or that the light-emitting semiconductor chip protrudes beyond the bottom surface of the carrier or the carrier body projects beyond the first side surface of the substrate of the light-emitting semiconductor chip. For example, the light-emitting semiconductor chip may be flush with the bottom surface of the carrier body and protrude from the carrier on the top surface over its entire length, minus the thickness of the carrier.

According to at least one embodiment of the light-emitting component, a mirror layer is applied to the bottom surface of the carrier body, which covers the bottom surface of the carrier body or the carrier body is formed to be reflective. In the case that a mirror layer is applied to the bottom surface of the carrier body, it is possible that the mirror layer also extends over the first side surface of the substrate of the light-emitting semiconductor chip. Furthermore, a mirror layer formed in the same manner, for example, may alternatively or additionally be arranged on the top surface of the carrier body.

In the case that the carrier body is formed to be reflective, it is formed, for example, with a plastic material into which light-scattering or light-reflecting particles, for example, particles made of titanium dioxide, are introduced. In this case, the carrier body is formed to be reflecting white. Furthermore, it is possible for the carrier body to be formed with a reflecting metal, which may be coated with a light-transmissive passivation material, for example, on the bottom surface and/or the top surface and in the region of the openings.

According to at least one embodiment of the light-emitting component, a connection comprising a first connection element and a second connection element, is arranged on the bottom surface of the carrier body, wherein the first connection element is electrically conductively connected to the first current distribution structure and the second connection element is electrically conductively connected to the second current distribution structure of the light-emitting semiconductor chip.

It is possible that the connection also extends in places over the first side surface of the substrate of the light-emitting semiconductor chip. In this case, the carrier also serves in particular to increase the contact surface on the side of the connection elements facing away from the bottom side of the carrier body in comparison to a component without increasing the carrier. In addition, a mechanical connection between the carrier and the light-emitting semiconductor chip may be provided via the connection elements, among other things. That is to say, in addition to the electrical properties for contacting the light-emitting semiconductor chip, the connection elements also have a mechanical function for attaching the semiconductor chip to the carrier.

The current distribution structures of the light-emitting semiconductor chip together with the connection then form the contacting of the light-emitting component.

According to at least one embodiment of the light-emitting component, an electrically insulating passivation layer is arranged between the connection and the carrier body. The electrically insulating passivation layer may extend from the bottom surface of the carrier body over the first side surface of the light-emitting semiconductor chip, so that the electrically insulating passivation layer also serves, in addition to its electrical properties, to mechanically attach the light-emitting semiconductor chip to the carrier body.

In addition, a method for producing a light-emitting component is provided. The method can be used in particular to produce a light-emitting component described here. This means that all features disclosed for the light-emitting component are also disclosed for the method and vice versa.

According to at least one embodiment of the method for producing a light-emitting component, initially a plurality of light-emitting semiconductor chips are provided. The light-emitting semiconductor chips can in particular be light-emitting semiconductor chips described here, so that all the features described for the light-emitting semiconductor chips are also disclosed for the method and vice versa.

In a next method step, carrier is provided comprising a carrier body having a top surface, a bottom surface opposite the top surface and a plurality of openings, which penetrate the carrier from its top surface to its bottom surface.

The light-emitting semiconductor chips are then inserted into the openings, wherein the light-emitting semiconductor chips are inserted into the openings with the first side surface in front of the top surface 1n the direction of the bottom surface of the carrier body. In this case, it is possible that precisely one of the light-emitting semiconductor chips is inserted into each opening of the carrier body. In this way, after the insertion of the plurality of light-emitting semiconductor chips has been completed, all openings of the carrier body are each provided with a light-emitting semiconductor chip.

In a final method step, the carrier is singulated with the plurality of light-emitting semiconductor chips to light-emitting components, wherein each light-emitting component comprises at least one of the light-emitting semiconductor chips. For this purpose, the carrier is severed in regions between light-emitting semiconductor chips.

Before the singulation, it is also possible for the light-emitting semiconductor chips to be mechanically attached to the carrier, which can be done, for example, by the described connection elements and/or the described passivation layer.

In the method described, it is in particular possible for the method to be carried out in the specified order.

According to at least one embodiment of the method, before the singulation, all the light-emitting semiconductor chips are surrounded by a casing, which completely surrounds the semiconductor chips and which adjoins the top surface of the carrier body between the semiconductor chips, wherein the singulation takes place through the casing.

The casing is, for example, a radiation-transmissive body, which may be formed with a plastic material such as, for example, a silicone or an epoxy resin. The casing may be applied, for example, by casting, spraying or injection moulding. Furthermore, the casing may contain particles of at least one luminescence conversion material, which are introduced into the plastic material. That is to say, light-emitting components result, in which the light-emitting semiconductor chip is completely surrounded by a casing, which may contain a conversion material, apart from the regions that project into the carrier body. In this way it is possible, for example, that at least 90%, in particular at least 95% of the outer surface of the light-emitting semiconductor chip is surrounded by a casing into which a luminescence conversion material may be introduced.

The luminescence conversion material may be formed, for example, to absorb at least part of the light emitted by the light-emitting semiconductor chip during operation and to emit light of a different wavelength, especially a longer wavelength.

BRIEF DESCRIPTION OF THE DRAWINGS

In the following, the light-emitting semiconductor chip described here, the light-emitting component described here, and the method described here are explained in more detail using exemplary embodiments and the corresponding figures.

FIGS. 3A to 3D show exemplary embodiments for producing a light-emitting component;

FIGS. 7A to 7G and FIGS. 8A to 8D show exemplary embodiments of a method for producing a light-emitting semiconductor chip;

FIGS. 9A to 9D show exemplary embodiments of a method for producing a light-emitting component;

FIGS. 10A to 10E show exemplary embodiments of light-emitting semiconductor chips and light-emitting components;

FIGS. 13A to 13E, FIGS. 14A to 14B, FIGS. 15A to 15C and FIGS. 16A to 16C show exemplary embodiments of a method for producing light-emitting components.

Identical, similar or similar acting elements are provided with the same reference signs in the figures. The figures and the proportions of the elements shown in the figures are not to be regarded as true to scale. Rather, individual elements may be oversized to make them easier to display and/or understand.

DETAILED DESCRIPTION OF ILLUSTRATIVE EMBODIMENTS

Figure 1A:
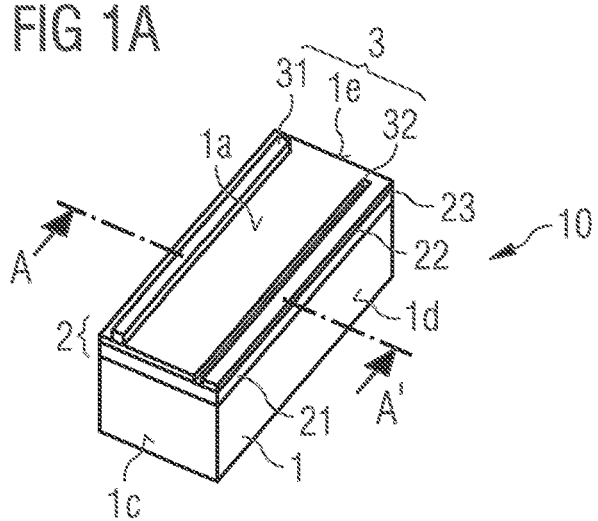
FIGS. 1A to 1E show exemplary embodiments of a light-emitting semiconductor chip.

FIG. 1A shows a first exemplary embodiment of a light-emitting semiconductor chip described here using a schematic perspective representation. The light-emitting semiconductor chip comprises a substrate 1, which may be, for example, a sapphire substrate. The substrate 1 comprises a first side surface 1c and a second side surface 1d, which has a larger surface area than the first side surface 1c. For example, the substrate 1 and thus the light-emitting semiconductor chip 10 are formed in the form of a square or rectangular column, in which the edge lengths on the first side surface 1 of the substrate are small compared to the edge lengths with the greatest extension in the region of the second side surface 1d.

Figure 1B:
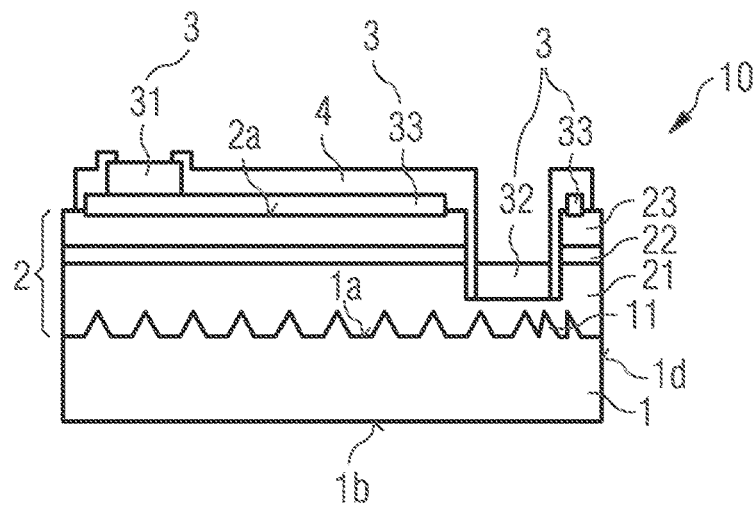

The sectional view of FIG. 1B shows that the substrate 1 still has a bottom surface 1b and a top surface 1a opposite the bottom surface. The top surface 1a may be, for example, pre-structured. The substrate 1 then has structures 11 on the top surface 1a, which, for example, allow a defect-reduced growth of a semiconductor body 2.

For example, the semiconductor body 2 is epitaxially deposited on the top surface 1a of the substrate 1. The semiconductor body 2 comprises a first conductive region 21, which is, for example, n-conducting, an active region 22 and a second conductive region 23, which may, for example, be formed in a p-conducting manner.

The contacting 3 is formed on the top surface 2a of the semiconductor body 2 facing away from the substrate 1. The contact 3 comprises a first current distribution structure 31, which is electrically conductively connected to the second conductive region 23 of the semiconductor body 2 via a current distribution layer 33. The current distribution layer 33 is, for example, a radiation-transmissive conductive layer which is formed with a transparent conductive oxide such as, for example, ITO.

Furthermore, the contacting comprises a second current distribution structure 32, which may be in direct contact with the first conductive region 21. The current distribution structures 31, 32 are formed, for example, with a metal such as gold. In the present case, the current distribution structures extend along two straight lines on and in the semiconductor body 2. The second current distribution structure 32 is arranged in a trench, which completely penetrates the second conductive region 23 and the active region 24. In the exemplary embodiment of FIG. 1A, both current distribution structures 31, 32 extend to an edge of the semiconductor body 2, which is adjacent to the first side surface 1C of the substrate. On the opposite third side surface 1e of substrate 1, there is a distance between the current distribution structures 31, 32 and the associated edge of the semiconductor body 2.

The current distribution structures 31, 32 are freely accessible from a side of the semiconductor body 2 facing away from the substrate. This means that the current distribution structures are not covered by further material. Where they are not in contact with the semiconductor body 2 or the current distribution layer 33, they are electrically insulated from these components by the insulation 4, which is formed by an electrically insulating material such as silicon dioxide. On their side facing away from the substrate 1, however, they are freely accessible and therefore electrically contactable.

The light-emitting semiconductor chip 10 shown in connection with FIG. 1A is free of any connection point on the side of the semiconductor body 2 facing away from the substrate 1 and on the bottom surface 1b of the substrate 1, which is formed for electrically contacting the first and second current distribution structures 31, 32. Furthermore, the light-emitting semiconductor chip is free of any connection point, which is formed for electrically contacting the first and second current distribution structures. This means that the light-emitting semiconductor chip 10 of the exemplary embodiment of FIG. 1A can and must be contacted directly at the current distribution structures 31, 32, and no further connection point is provided for contacting the semiconductor chip.

Figure 1C:
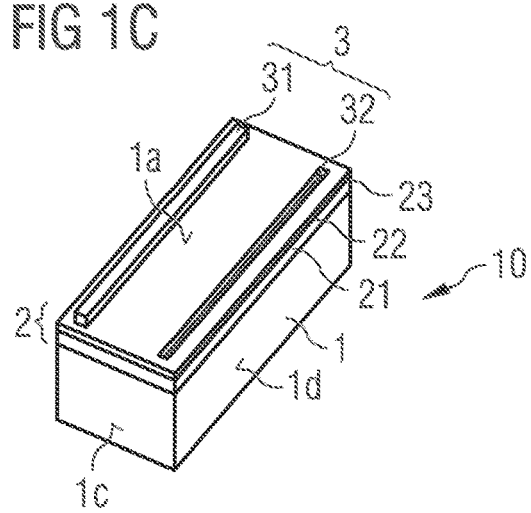

In connection with the schematic perspective representation of FIG. 1C, a further exemplary embodiment of a light-emitting semiconductor chip described here is described, in which the current distribution structures 31, 32 do not extend to any edge of the semiconductor body 2, but rather have a distance of at least 10 µm, in particular of at least 25 µm, from each edge of the semiconductor body 2.

Figure 1D:
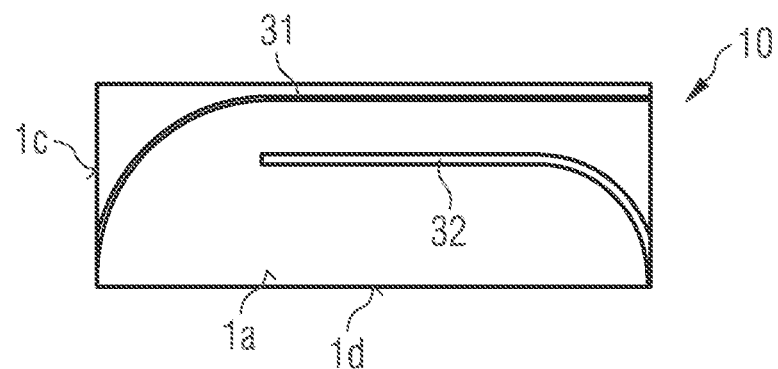
Figure 1E:
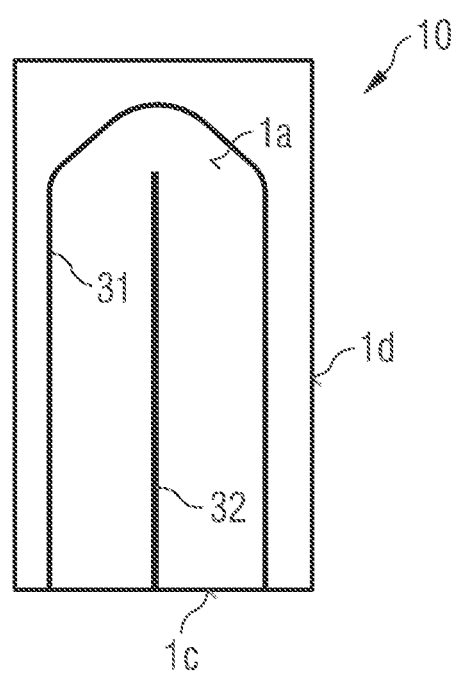

In connection with FIGS. 1D and 1E, in contrast to the exemplary embodiments of FIGS. 1A and 1C, exemplary embodiments are shown, in which the current distribution structures 31, 32 are not formed along their entire length along straight lines. Instead, the current distribution structures 31, 32 have regions extending in a curved manner at least in places. With such current distribution structures 31, 32 it is possible to inject the current as evenly as possible into the active region 22. Compared to the current distribution structures of FIGS. 1A and 1B, which extend exclusively along straight lines, however, the production of such curved current distribution structures is more complex and therefore more cost-intensive.

Figure 2A:
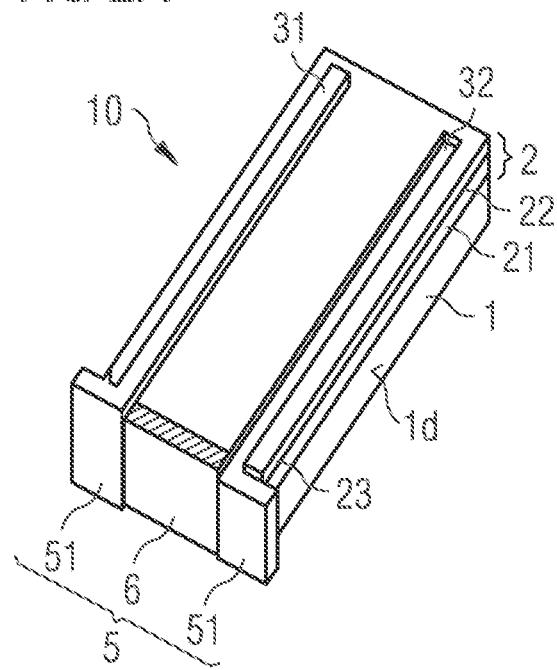
FIGS. 2A to 2B show other exemplary embodiments of a light-emitting semiconductor chip.
Figure 2B:
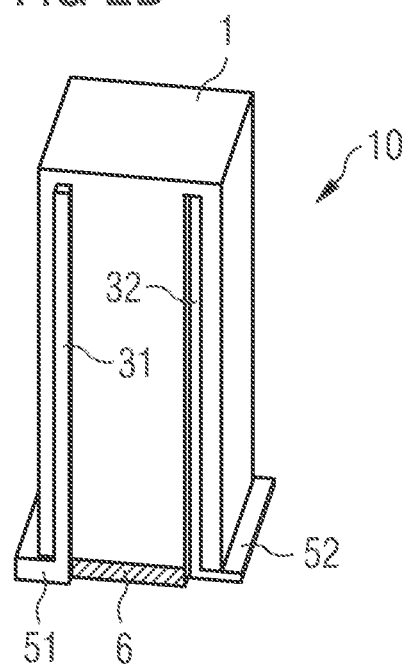

In connection with the schematic perspective representations of FIGS. 2A and 2B, a further exemplary embodiment of a light-emitting semiconductor chip described here is explained in more detail. In the exemplary embodiments of FIGS. 2A and 2B, the light-emitting semiconductor chip comprises a connection 5, which comprises a first connection element 51 and a second connection element 52. The connection elements 51, 52 are formed on the first side surface 1c of the substrate 1. In this exemplary embodiment, the first side surface 1c of the substrate 1 forms the mounting surface of the semiconductor chip 10, on which the semiconductor chip 10 can, for example, be surface-mounted via the connection elements 51, 52.

The first connection element 51 is electrically conductively connected to the first current distribution structure 31 and the second connection element 52 is electrically conductively connected to the second current distribution structure 32.

The light-emitting semiconductor chip 10 further comprises a mirror 6, which is arranged on the first side surface 1c, which is formed as a mounting surface of the semiconductor chip 10. In this case, for example, the mirror 6a is a Bragg mirror, which is formed by the sequence of different dielectric layers.

With the light-emitting semiconductor chip 10 of FIGS. 2A and 2B, light is emitted almost over the entire outer surface of the light-emitting semiconductor chip during operation. The mirror 6 is located only on the first side surface 1c, which is provided as a mounting surface, so that no light can escape outwards. In this case, the light-emitting semiconductor chip 10 is formed in the form of a square column, wherein the second side surface 1d has a surface area, which is at least twice as large as the surface area of the first side surface 1c.

In connection with the schematic representations of FIGS. 3A to 3F, a first exemplary embodiment of a method for producing a light-emitting component described here is shown.

As shown in FIG. 3A, the method provides a carrier 7 comprising a carrier body 71. The carrier body 71 is formed, for example, from a plastic by means of an injection molding process. The carrier body has a top surface 71a and a bottom surface 71b. In addition, the carrier body has a plurality of openings, which completely penetrate the carrier body from the top surface 71a to the bottom surface 71b. The size and shape of the openings are formed in such a way that they can each receive a light-emitting semiconductor chip, as described, for example, in connection with FIGS. 1A to 1E. For this purpose, the light-emitting semiconductor chips are inserted with the first side surface 1c into the openings 74 of the carrier body 71 of the carrier 7. This is shown in connection with FIG. 3A. The resulting arrangement of the semiconductor chips 10 in the openings 74 of the carrier body 71 of the carrier 7 is shown in FIG. 3B.

In a next method step, FIG. 3C, connections 5 are produced, each of which comprises a first connection element 51, which is electrically conductively connected to the first current distribution structure 31 of an associated semiconductor chip 10 and a second connection element which is connected to the second current distribution structure.

Figure 3D:
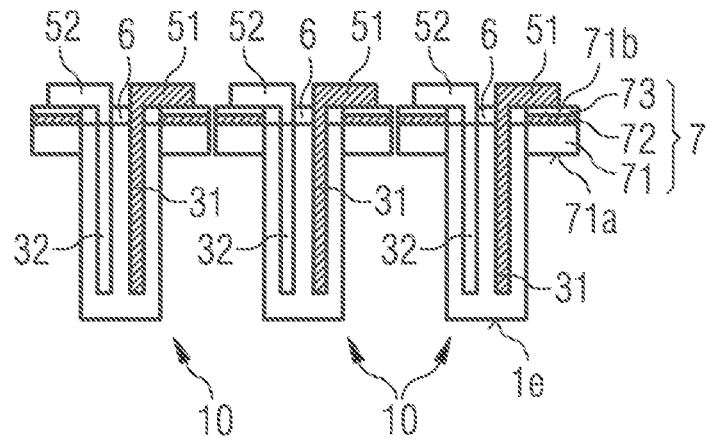

As shown in FIG. 3D, a passivation layer 72 and a mirror layer 72 can be arranged between the carrier body 71 and the connections 5. Furthermore, the light-emitting semiconductor chips can each have a mirror 6 on the first side surface 1c, as is described in more detail, for example, in connection with FIGS. 2A and 2B.

Subsequently, the arrangement of the carrier 7 and the semiconductor chip 10 is singulated to individual light-emitting components 100, which in the present case each comprise a part of the carrier body 71 and exactly one light-emitting semiconductor chip 10.

Figure 3E:
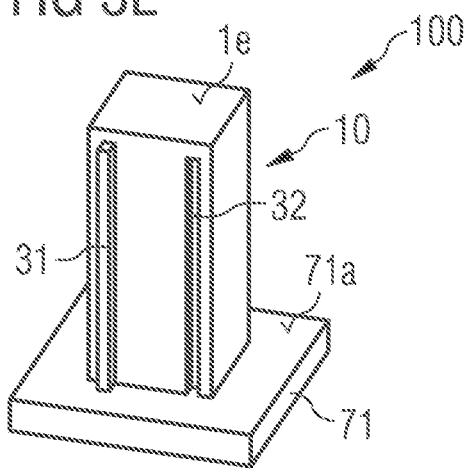
FIGS. 3E to 3F show exemplary embodiments of a light-emitting component.
Figure 3F:
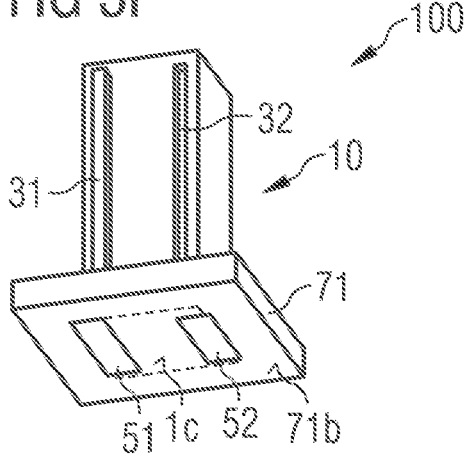

A resulting light-emitting component 100 is shown, for example, in the schematic perspective representations of FIGS. 3E and 3F. This results in surface-mountable light-emitting components, which can be contacted on the side of the carrier body 71 facing away from the semiconductor chip 10 via the connection elements 51, 52.

Figure 4A:
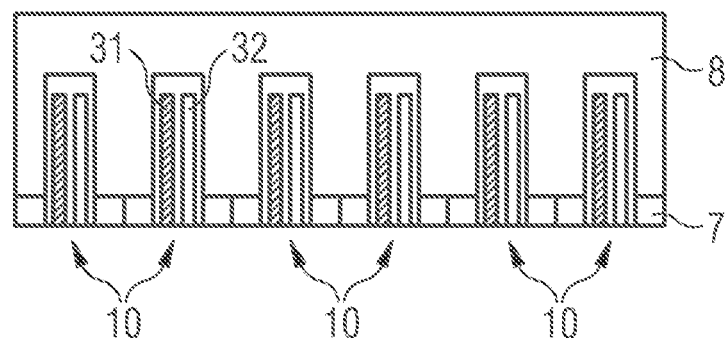
FIGS. 4A to 4C show exemplary embodiments of a method for producing a light-emitting component.
Figure 4B:
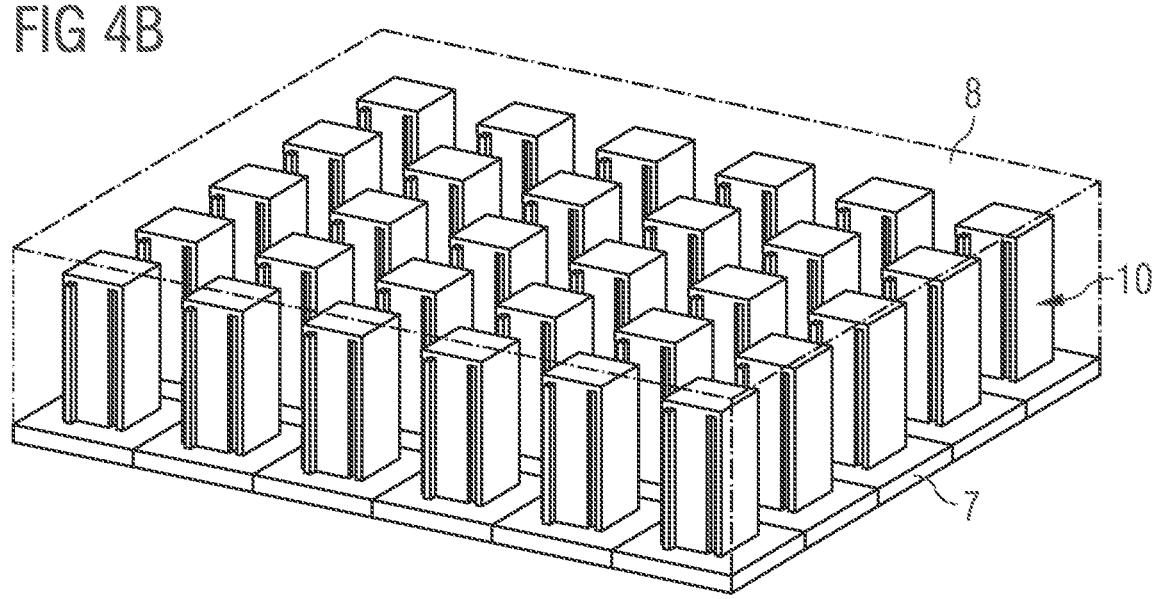
Figure 4C:
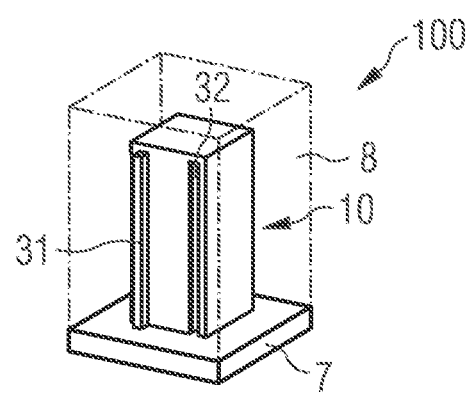

In connection with the schematic representations of FIGS. 4A and 4C, a further exemplary embodiment of a method for producing a light-emitting component described here is explained in more detail. In contrast to the exemplary embodiment of FIGS. 3A to 3F, in this exemplary embodiment the semiconductor chips 10 inserted into the carrier 7 are provided with a casing 8, for example, by means of injection moulding, see FIGS. 4A and 4B. The casing is formed, for example, with a plastic material, such as a silicone, into which particles of a luminescence conversion material are introduced.

In the step of singulating the arrangement of the carrier, the light-emitting semiconductor chip 10 and the casing 8 to form individual light-emitting components, the singulation takes also place through the casing 8, for example, by sawing. In this way, the light-emitting component shows traces of a singulation process, such as a sawing process, in the region of the carrier 7 and in the region of the casing 8 on the side surfaces. These traces can be saw grooves or similar.

The result is a light-emitting component, in which the light-emitting semiconductor chip 10 can be coated on more than 95% of its entire outer surface with the casing 8 filled with luminescent conversion material. In this way, for example, white mixed light can be generated particularly efficiently.

Figure 5A:
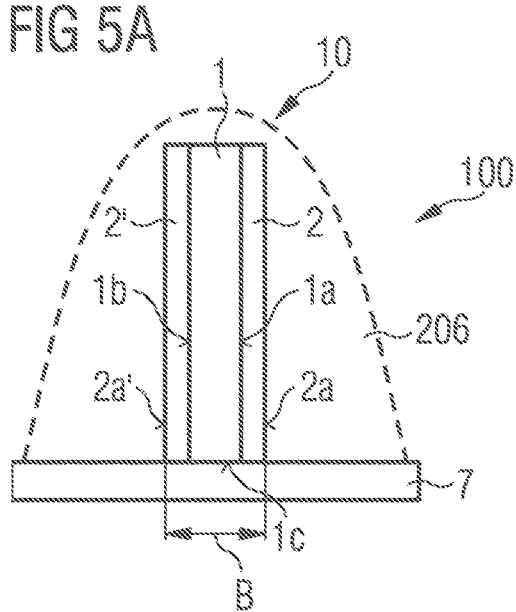
FIGS. 5A to 5C and FIGS. 6A to 6B show exemplary embodiments of light-emitting components.
Figure 5B:
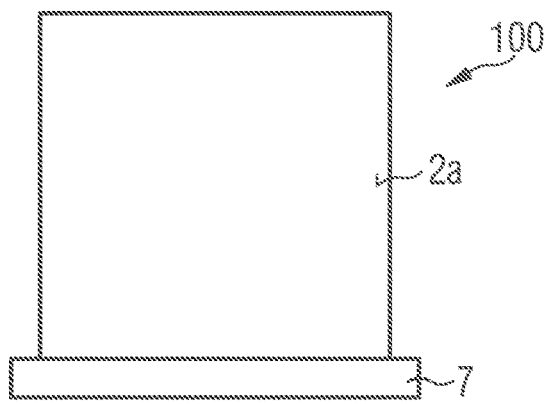
Figure 5C:
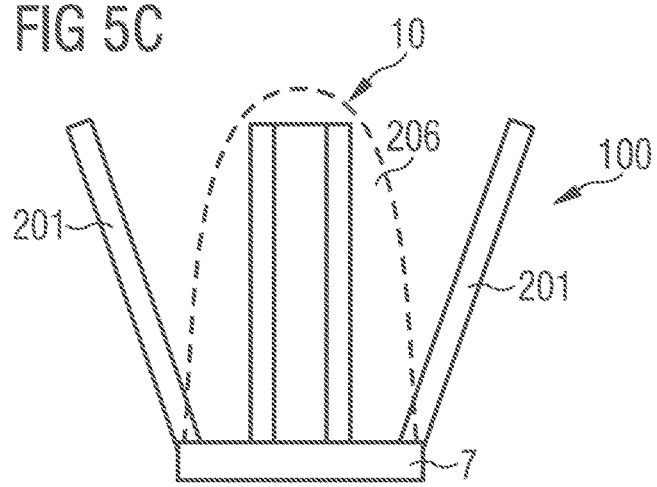

The schematic sectional representations and side views of FIGS. 5A, 5B, 5C show further exemplary embodiments of light-emitting components 100 described here. In the exemplary embodiment of FIGS. 5A and 5B, a light-emitting semiconductor chip 10, in which the semiconductor body 2 is arranged on the top surface 1a of the substrate 1 and the further semiconductor body 2' is arranged on the bottom surface 1b of the substrate 1 facing away from the semiconductor body 2. The semiconductor chip 10 is mounted on a carrier 7. The carrier 7 can be, for example, a connection carrier such as a circuit board or a lead frame. The semiconductor chip 10 is attached to the first side surface 1c of the substrate 1 on the carrier 7. It has a width B of at least 50 µm and at most 500 µm, in particular between at least 150 m and at most 250 µm, for example, 200 µm. The mounting surface of the semiconductor chip on the carrier is, for example, 0.2 mm2. The top surface 2a facing away from the substrate and the further top surface 2a' facing away from the substrate 1 each have a base area of 1 mm2, for example, so that the semiconductor chip 10 has a total light-emitting outer surface of 2 mm2. By varying the size of the semiconductor chip 10, i.e., changing its length, width and height, the ratio between the area of the top surfaces and the area of the mounting surface of the semiconductor chip can be set very flexibly. It is possible that the top surfaces 2a, 2a' have a common area which is at least a factor of 10 larger than the mounting surface of the semiconductor chip on the carrier 7.

As is shown in the schematic sectional representation of FIG. 5C, such a semiconductor chip 10 can be inserted, for example, into a housing having a reflector 201. In this way, very compact designs in reflector arrangement are possible.

Furthermore, it is possible to arrange a lens-shaped cover body 206 around the semiconductor chip 10. The lens-shaped cover body can be transparent, for example, in a see-through manner. Furthermore, it is possible that the lenticular cover body to comprise a matrix material, into which radiation-reflecting, radiation-scattering and/or radiation-converting particles are introduced. For example, the cover body 206 can then comprise at least one phosphor. The cover body can be formed, for example, with a matrix material, which contains or consists of silicone and/or epoxy resin.

In FIGS. 5A to 5C, no contacting and associated current distribution structures are shown.

Figure 6A:
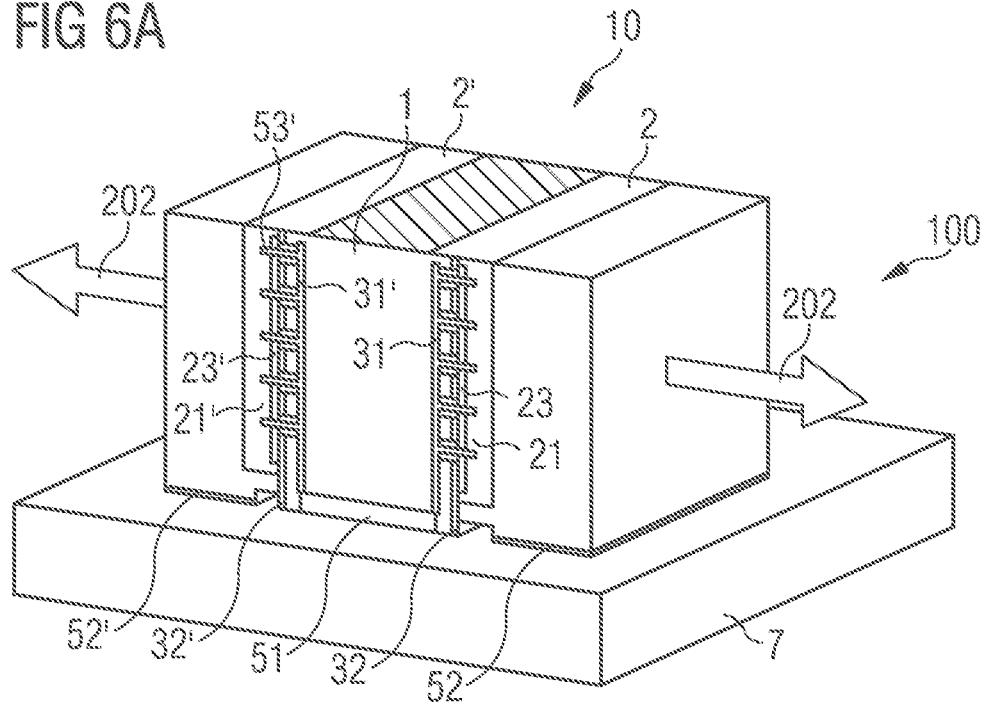
Figure 6B:
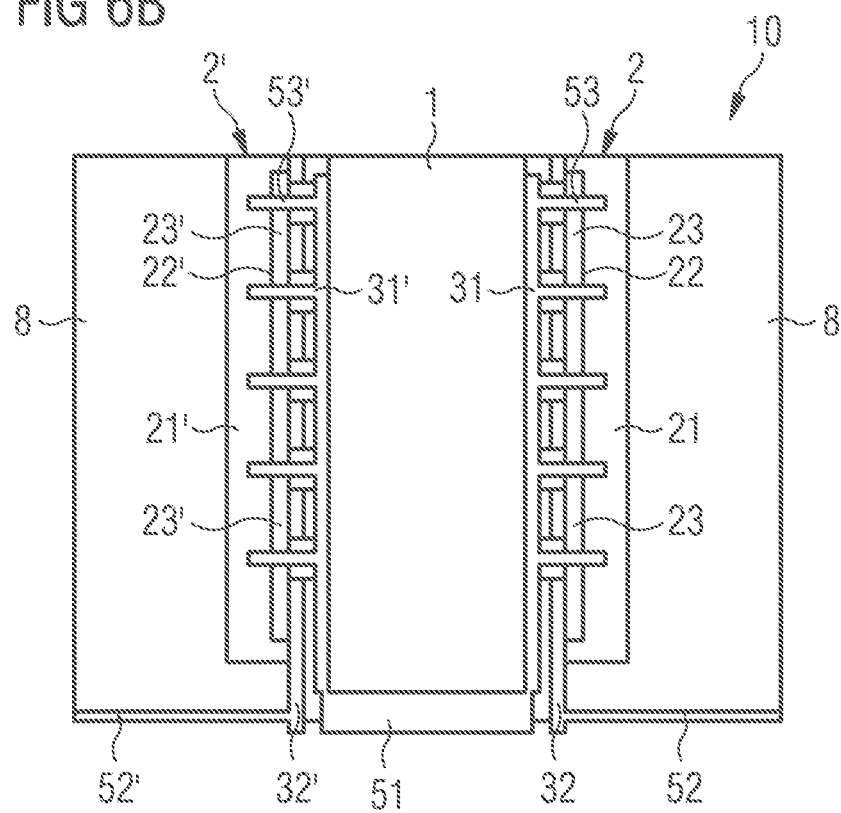

One possibility for forming the contacting 3 and the further contacting 3' is explained, for example, using the schematic representations of FIGS. 6A and 6B.

FIG. 6A shows a schematic perspective representation of a light-emitting semiconductor chip 10 described here, which is mounted on a carrier 7 to form a light-emitting component 100 described here.

The semiconductor chip 10 comprises a substrate 1, which can be, for example, a growth substrate for the semiconductor body 2 and the further semiconductor body 2'. Furthermore, it is possible that the substrate 1 is a carrier, on which the semiconductor body 2 and the further semiconductor body 2' are applied.

The semiconductor body 2 and the semiconductor body 2' are contacted via connection elements 51, 52, 52'. For example, the semiconductor bodies 2, 2' can be contacted on the n-side via the common first connection element 51. The first connection element 51 is then electrically conductively connected to the first current distribution structure 31 and to the further first current distribution structure 31'. These, for example, connect the semiconductor body and the further semiconductor body 2' on the n-side to the first conductive region 21 and to the further first conductive 21' via plated-through holes 53' and further plated-through holes 53'.

On the p-side, the semiconductor body and the further semiconductor body 2' can be contacted via the second connection element 52 and the further second connection element 52', which in turn are connected to the second current distribution structure 32 and the further second current distribution structure 32', and connect the semiconductor body 2 on the p-side to the second conductive region 23 and connect the further semiconductor body 2' on the p-side to the further second conductive region 23'. The respective active regions 22, 22' are arranged between the two conductive regions 21, 23 and the two further conductive regions 21' and 23'.

The semiconductor chip 1 of the exemplary embodiments of FIGS. 6A and 6B thus has contacts 3 and further contacts 3' comprising the current distribution structures 31, 31', 32, 32' and the plated-through holes 53, 53', which are arranged below the top surfaces 2a, 2' of the semiconductor bodies 2, 2'.

Using the schematic representations of FIGS. 7A to 7G, an exemplary embodiment of a method described here for producing a light-emitting semiconductor chip 10 described here is explained in more detail. In the method, initially, a substrate is provided. The substrate 1 is, for example, a wafer, which is formed with silicon or consists of silicon, FIG. 7A.

Figure 7A:
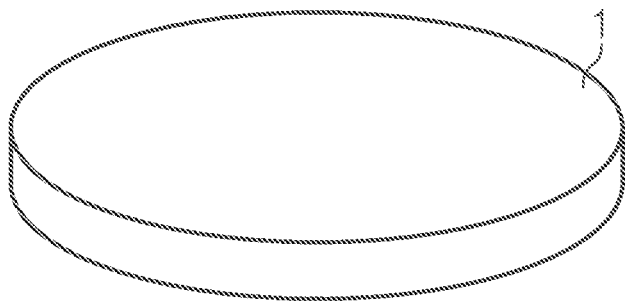
Figure 7B:
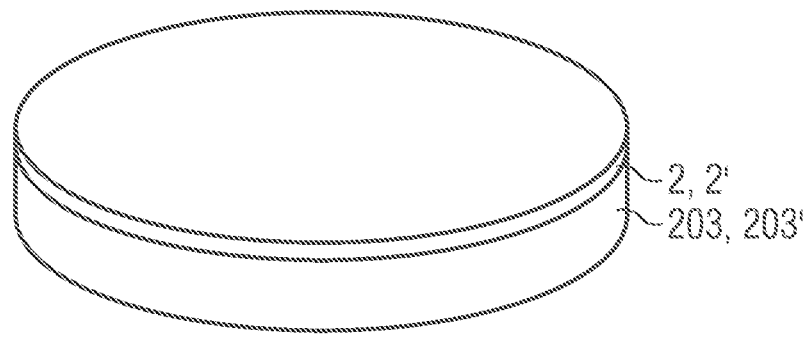

FIG. 7B shows that a growth substrate 203 with a semiconductor body 2 deposited thereon is provided as a wafer arrangement. The growth substrate 203 is, for example, a wafer which is formed with sapphire or consists of sapphire. In the same way, a further growth substrate 203' having a further semiconductor body 2' applied thereto is provided.

Figure 7C:
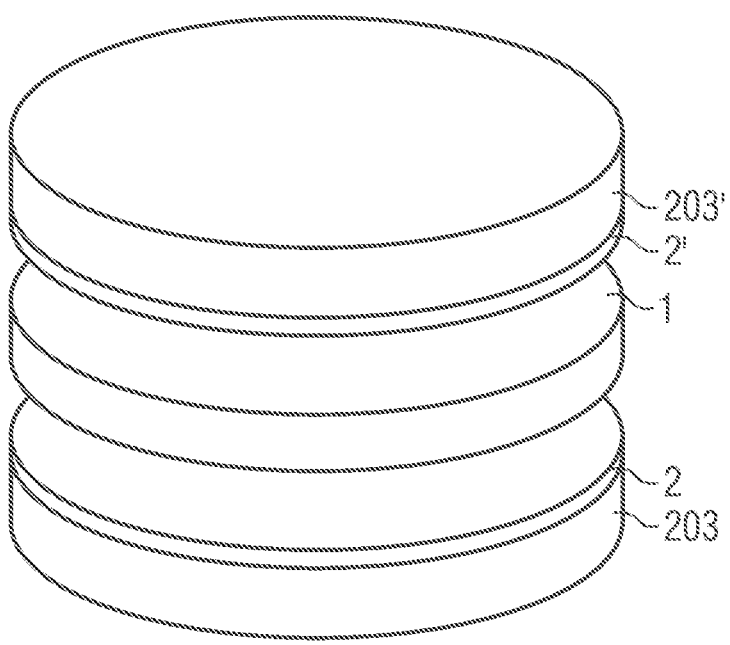
Figure 7D:
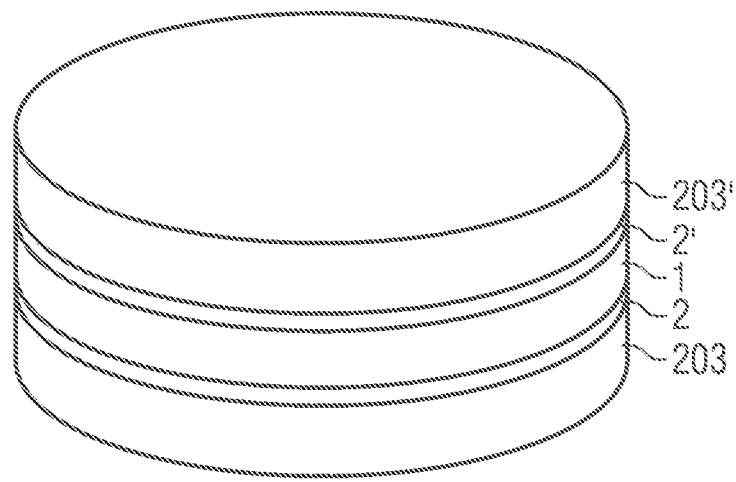

FIG. 7C shows that the wafer arrangements with the semiconductor body 2 and the further semiconductor body 2' are in each case attached to the carrier 1, for example, by means of direct bonding. The result is the arrangement of growth substrate 203, semiconductor body 2, substrate 1, further semiconductor body 2' and further growth substrate 203 as illustrated in FIG. 7D.

Figure 7E:
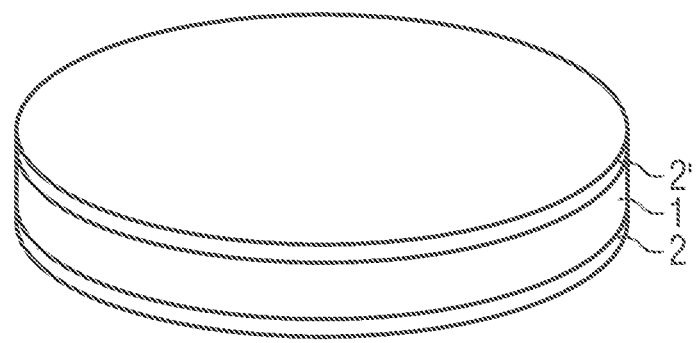

Subsequently, the growth substrate 203 and the further growth substrate 203' are removed, for example, by means of a laser lift-off process, so that the wafer results as shown in FIG. 7E, in which the semiconductor body 2 and the further semiconductor body 2' are applied to sides of the substrate 1, which are remote from one another.

Figure 7F:
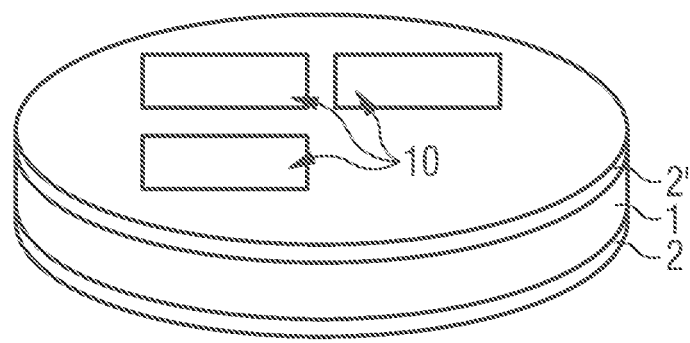
Figure 8A:
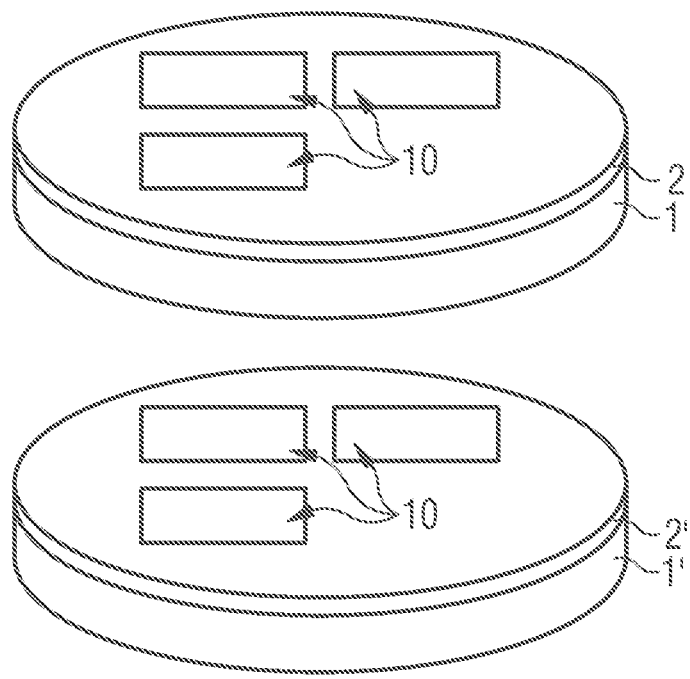
Figure 8B:
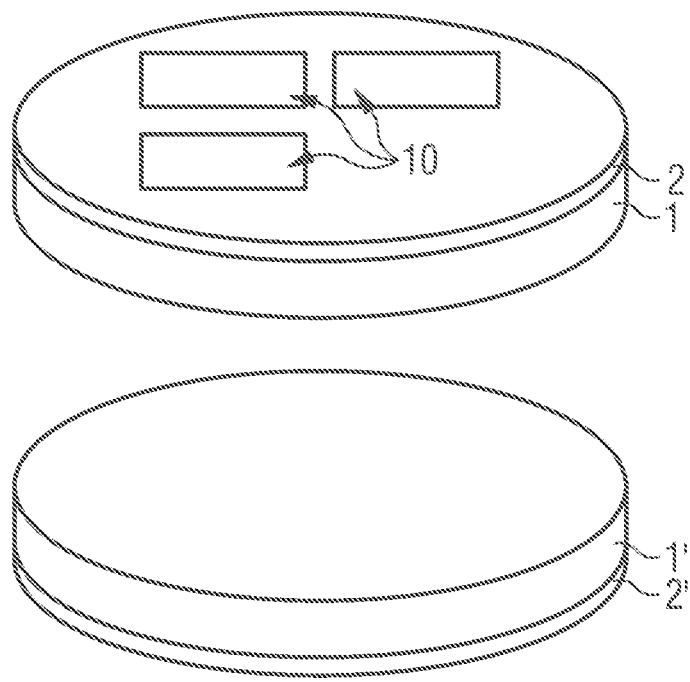
Figure 8C:
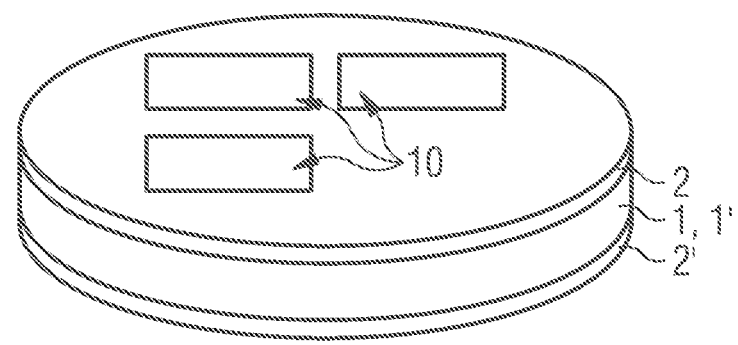
Figure 8D:
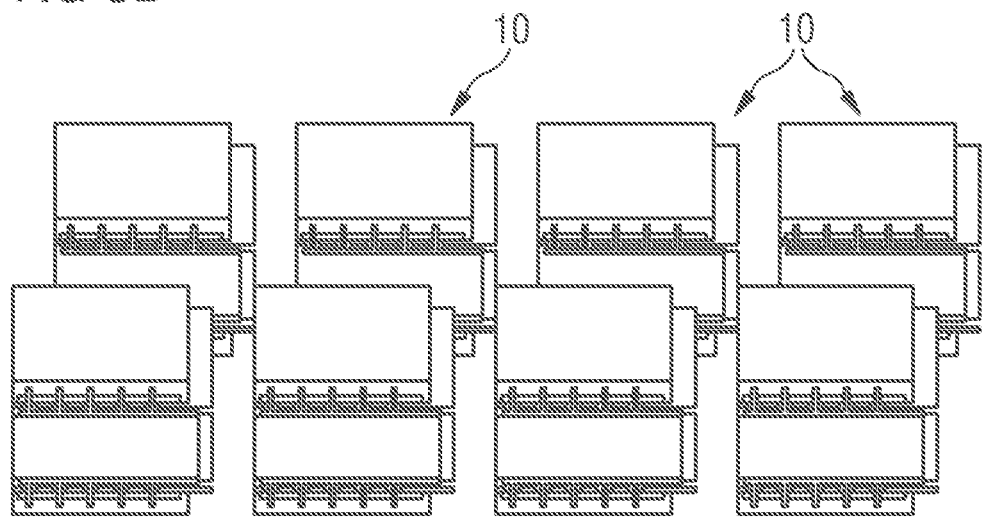

In the subsequent method step, FIG. 7F, an adjusted two-sided chip process is carried out for defining the light-emitting semiconductor chips 10, which are produced by singulating the arrangement.

In the last method step, FIG. 7G, for example, the contacts, for example, the connection elements 51, 52, 52' can be produced.

An alternative production method is described in connection with FIGS. 8A to 8D. In this method, two wafer arrangements are first provided, each comprising a substrate 1 and a semiconductor body 2 or a further substrate 1' and a further semiconductor body 2'. The substrates 1, 1' can be, for example, substrates formed with sapphire or silicon, FIG. 8A.

In these arrangements, the semiconductor chips 10 can be structured. Subsequently, the two substrates 1, 1' are connected, for example, by direct bonding, compare FIGS. 8B and 8C. A subsequent singulation into individual semiconductor chips 10 then follows. This is schematically shown in connection with FIG. 8D.

In connection with the schematic sectional representations of FIGS. 9A to 9D, an exemplary embodiment of a method described here for producing a light-emitting component described here is explained in more detail.

In the method, initially, a carrier 7 is provided, which can be, for example, a circuit board or a temporary carrier. Semiconductor chips 10 described here are mounted on the carrier 7, in such a way that the first substrate side surfaces 1c face the carrier 7, FIG. 9A.

The semiconductor chips 10 are then surrounded by a casing 8, which is formed, for example, with a plastic such as a silicone or an epoxy resin and can contain further particles such as, for example, radiation-scattering and/or radiation-reflecting and/or radiation-converting particles. The casing 8 is applied around the semiconductor chips 10 in such a way that the semiconductor chips 10 project from the casing 8 on the substrate side and the semiconductor bodies 2, 2' of the semiconductor chips 10 are completely surrounded by the casing 8. This is shown by way of example in FIG. 9B. Subsequently, the first current distribution structures 31, 31' can be connected to the first connection element 51 and the second current distribution structures 32, 32' are connected to the second connection elements 52, 52'. The connection elements 51, 52, 52' can be formed, for example, with an electrically conductive material such as a metal and can be patterned photolithographically.

In the next method step, FIG. 9C, a singulation on the carrier 7 is carried out. If the carrier 7 is an auxiliary carrier, it is subsequently detached.

Alternatively, the carrier 7 can also be singulated, resulting in the light-emitting component 100 shown in FIG. 9D.

After the singulation through the casing 8, it is possible to form at least one outer surface of the casing 8 in a radiation-reflecting manner. For this purpose, for example, a layer made of a plastic material such as silicone filled with titanium dioxide can be used.

In connection with the schematic perspective representation of FIG. 10A, a further exemplary embodiment of a light-emitting semiconductor chip 10 described here is explained in more detail. In this exemplary embodiment, the light-emitting semiconductor chip 10 comprises two semiconductor bodies 2, 2', which are arranged on different sides of the substrate 1. Each semiconductor body comprises an active region 22, 22'. In the exemplary embodiment of FIG. 10A, the current distribution structures 31, 32, 31', 32' are each arranged on the outer side of the associated semiconductor body 2, 2'. The two semiconductor bodies 2, 2' are electrically connected to one another via the connection elements 51, 52. For this purpose, an insulation 4 can be arranged between the semiconductor bodies 2, 2' and the substrate on the one hand and the connection elements 51, 52 on the other hand, which is formed, for example, as an electrically insulating layer. In the present case, the semiconductor bodies are electrically connected in parallel or in series via the connection elements 51, 52.

Figure 10B:
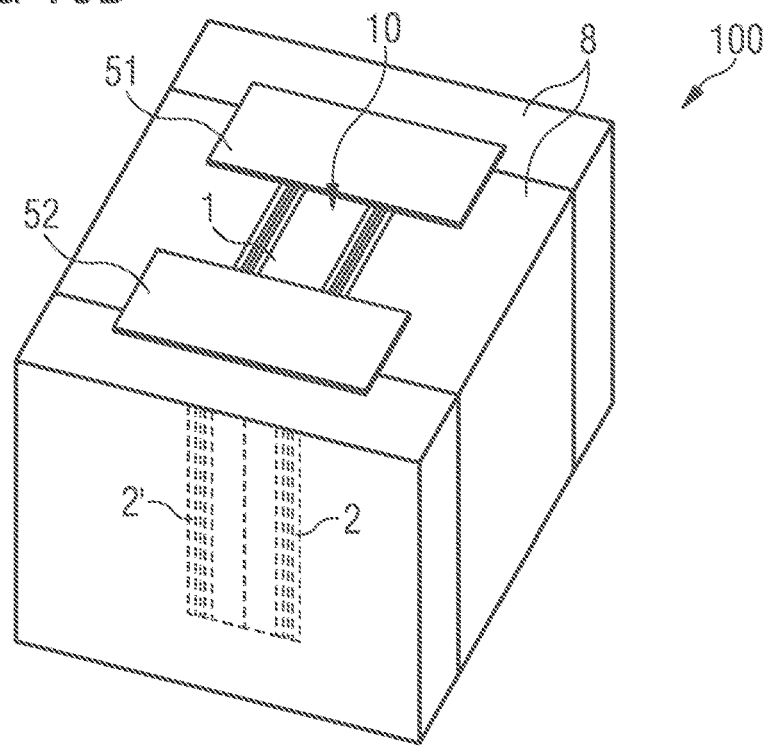

In the schematic representation of FIG. 10B, a semiconductor chip 10 is shown, as is described in connection with FIG. 10A, is surrounded by a radiation-transmissive casing 8, which contains, for example, a silicone, thereby forming a light-emitting component 100. The connection elements 51, 52 are arranged in places on the casing 8 and are in direct contact therewith. In this way it is possible to increase the contact area of the connection elements 51, 51, which improves both the electrical connectable capability and the dissipation of heat during operation of the light-emitting component 100.

Figure 10C:
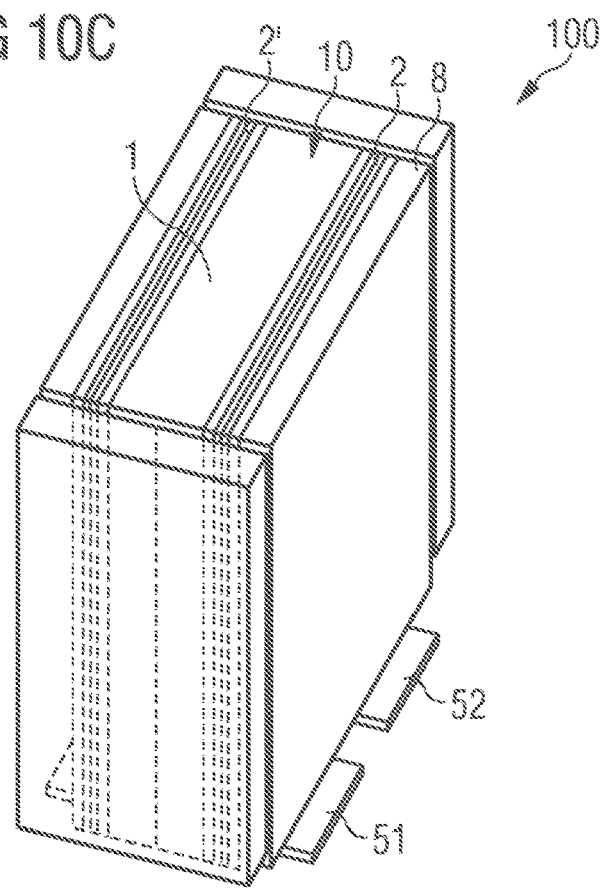

FIG. 10C shows the light-emitting component of FIG. 10B in a further variant, in which the connection elements 51, 52 are formed in such a way that they project beyond side faces of the casing 8 and thus provide a particularly large connecting surface. The light-emitting components shown in FIGS. 10B and 10C form so-called chip-size or chip-scale packages, in which the volume of the component 100 is essentially determined by the volume of the light-emitting semiconductor chip 10.

Figure 10D:
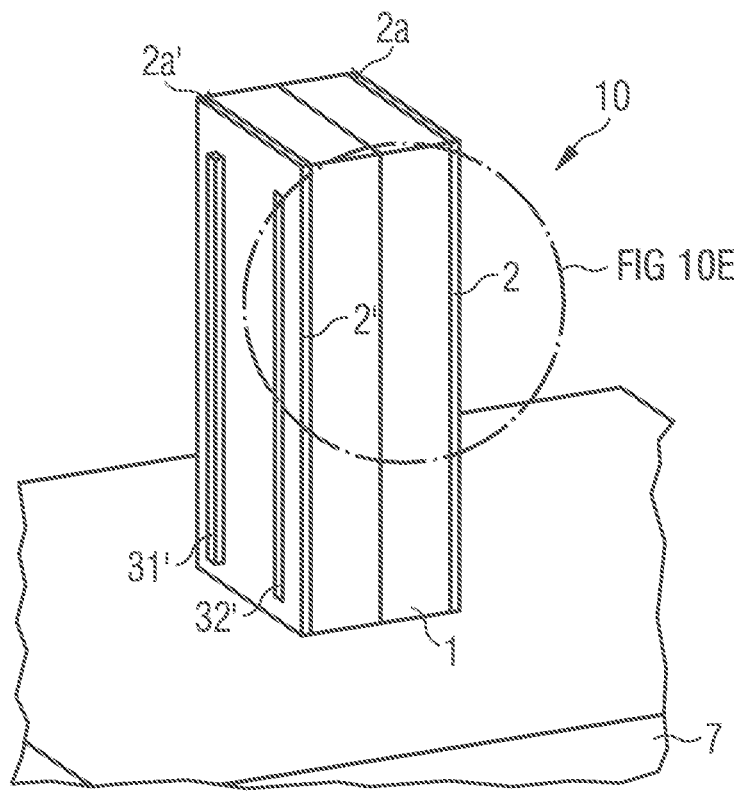

In connection with FIG. 10D, a light-emitting semiconductor chip is described, as is described, for example, in connection with FIG. 10A, is mounted on a carrier 7. The carrier 7 is, for example, a circuit board. The light-emitting semiconductor chip 10 has a substrate 1 formed, for example, with sapphire, as shown in the schematic sectional representation of FIG. 10E. The semiconductor body 2 is arranged on the top surface 1a of the substrate 1, which in the direction away from the substrate has the first conductive region 21, which, for example, is n-conducting, the active region 22 and the second conductive region 23, which, for example, is p-conducting.

At the bottom surface 1b of the substrate facing away from the top surface 1a, the further semiconductor body 2' is arranged, which has, in the direction away from substrate 1, the further first region 21', which, for example, is n-conducting, the further active region 22' and the further second conductive region 23', which, for example, is p-conducting. The substrate 1 can be a growth substrate, on which the semiconductor body 2 and the further semiconductor body 2' are respectively epitaxially deposited. Furthermore, it is possible that each semiconductor body 2, 2' is assigned its own substrate 1, 1'. The substrates 1.1' are then connected to one another, for example, by means of direct bonding, soldering or adhesive bonding. In this case it is possible that the entire light-emitting semiconductor chip is formed to be transparent.

Figure 10E:
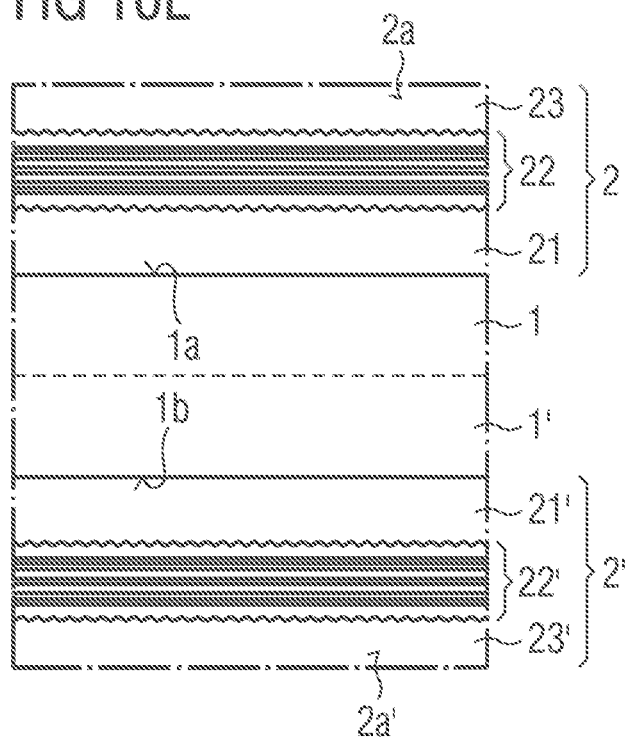

In connection with the schematic representations of FIGS. 11A to 11E and 12A to 12C, exemplary embodiments of a method are described with which such a semiconductor chip 10, as shown in FIG. 10E, can be produced.

In connection with FIGS. 11A to 11E, a method is described in which the two semiconductor bodies 2, 2' are epitaxially deposited on different substrates and the substrates are connected to one another. For this purpose, for example, initially a substrate 1 is provided, which can be a sapphire wafer, FIG. 1A.

Figure 11A:
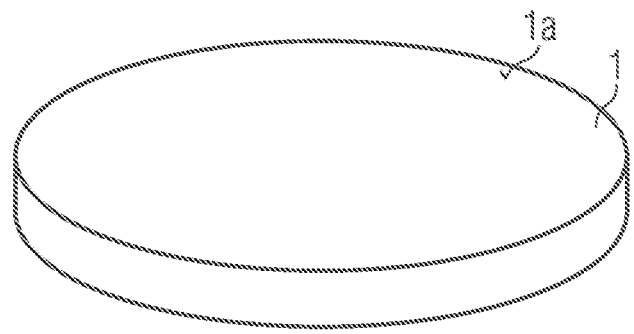
FIGS. 11A to 11E and FIGS. 12A to 12C show exemplary embodiments of methods for producing light-emitting semiconductor chips.
Figure 11B:
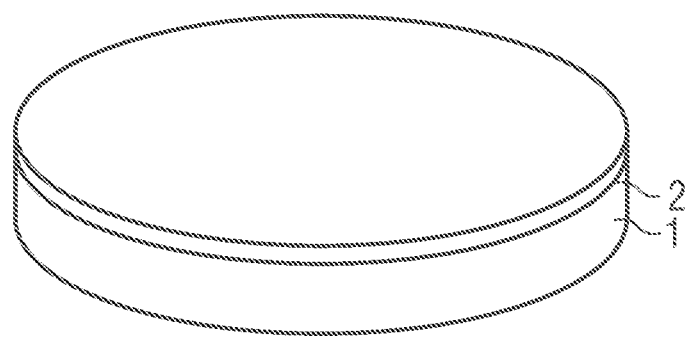

Subsequently, a semiconductor body 2 is deposited epitaxially on a top surface 1a of the substrate 1, FIG. 11B.

Figure 11C:
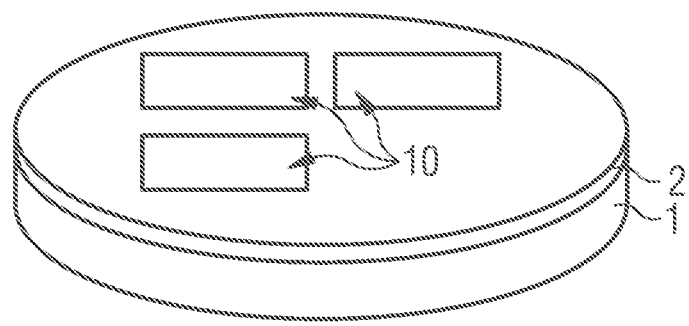

In the next method step, FIG. 11C, the semiconductor chips 10 can be structured into the arrangement thus produced and the substrate 1 can be thinned, for example.

Figure 11D:
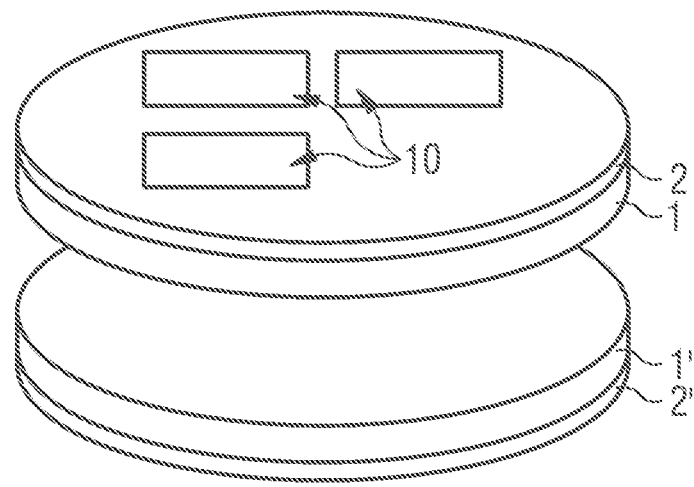
Figure 11E:
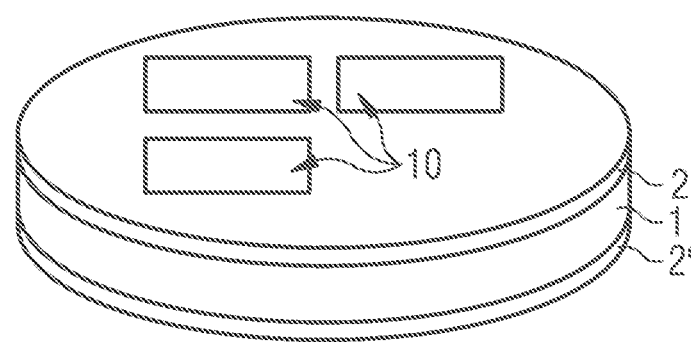

Subsequently, FIG. 11D, an arrangement produced in the same manner is provided with a further substrate 1' and a further semiconductor body 2' and, FIG. 11E, is connected to the first arrangement. The connection can take place, for example, by adhesive bonding, soldering or direct bonding. In this case, the chips 10 structured in the two arrangements are adjusted with respect to one another, so that semiconductor chips 10 are subsequently produced, as shown, for example, in FIG. 10E. Mirror layers can also be arranged between the two substrates, i.e., the substrate 1 and the further substrate 1'. In this case, soldering is particularly suitable as a connecting technique between the two substrates.

Figure 12A:
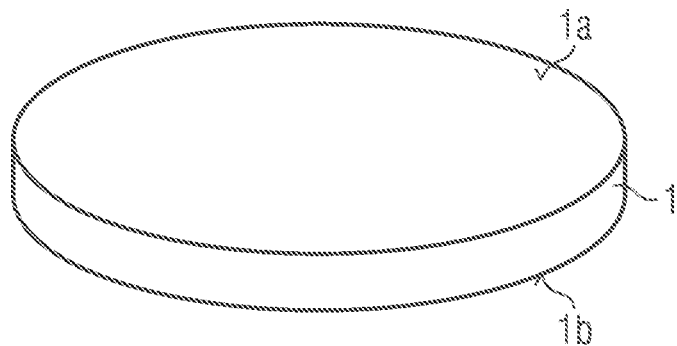
Figure 12B:
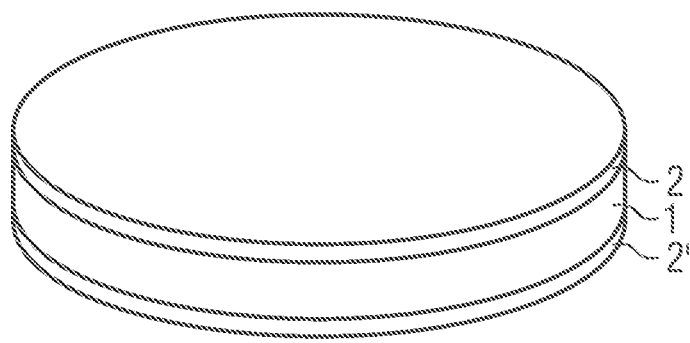
Figure 12C:
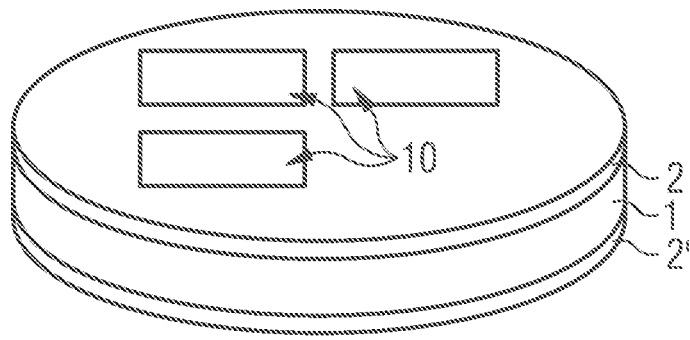

In an alternative method, which is shown in connection with FIGS. 12A to 12C, the semiconductor bodies 2, 2' are deposited epitaxially on different sides of the substrate 1.

In the exemplary embodiment of the method of FIGS. 12A to 12C, initially a substrate 1 is provided, which is, for example, a sapphire substrate, FIG. 12A. The semiconductor body is subsequently produced epitaxially on the top surface 1a of the substrate 1 by growth on the C-plane of the substrate 1.

On the underside of the substrate 1, as shown in FIG. 12B, the further semiconductor body 2' is produced, which is grown on the bottom surface 1b of the substrate, so that the further semiconductor body 2', if it is a nitride-based semiconductor body, grows there in an N-face orientation.

Finally, FIG. 12C, the semiconductor chips 10 are produced aligned on both sides and singulation into semiconductor chips 10 as shown in FIG. 10E, for example. For structuring the semiconductor chips 10, for example, a front-to-back adjusted lithography technique can be used.

The semiconductor bodies 2, 2' can be successively deposited on the sapphire substrate. Alternatively, it is possible that the two semiconductor bodies 2, 2' are produced simultaneously in an epitaxial system. The growth of the further semiconductor body 2' in the N-face orientation can also result in an improvement in the efficiency during the generation of light in the further active region 22' of the further semiconductor body 2', as the negative effects of piezoelectric fields are reduced. Different growth methods can be used to produce the two semiconductor bodies 2, 2'. For example, a metal organic vapor phase epitaxy (MOVPE) method can be used for producing the semiconductor body, whereas a hydride vapor phase epitaxy (HVPE) method or PAMBE (plasma assisted molecular beam epitaxy) method can be used in order to produce the further semiconductor body 2'. Furthermore, it is possible that the semiconductor bodies 2, 2' differ in terms of the wavelength of the generated light, which is generated during operation in the active region 22, 22' of the respective semiconductor body 2, 2'.

In connection with the schematic sectional representations of FIGS. 13A to 13E, an exemplary embodiment of a method for producing a light-emitting component described here is explained in more detail.

Figure 13A:
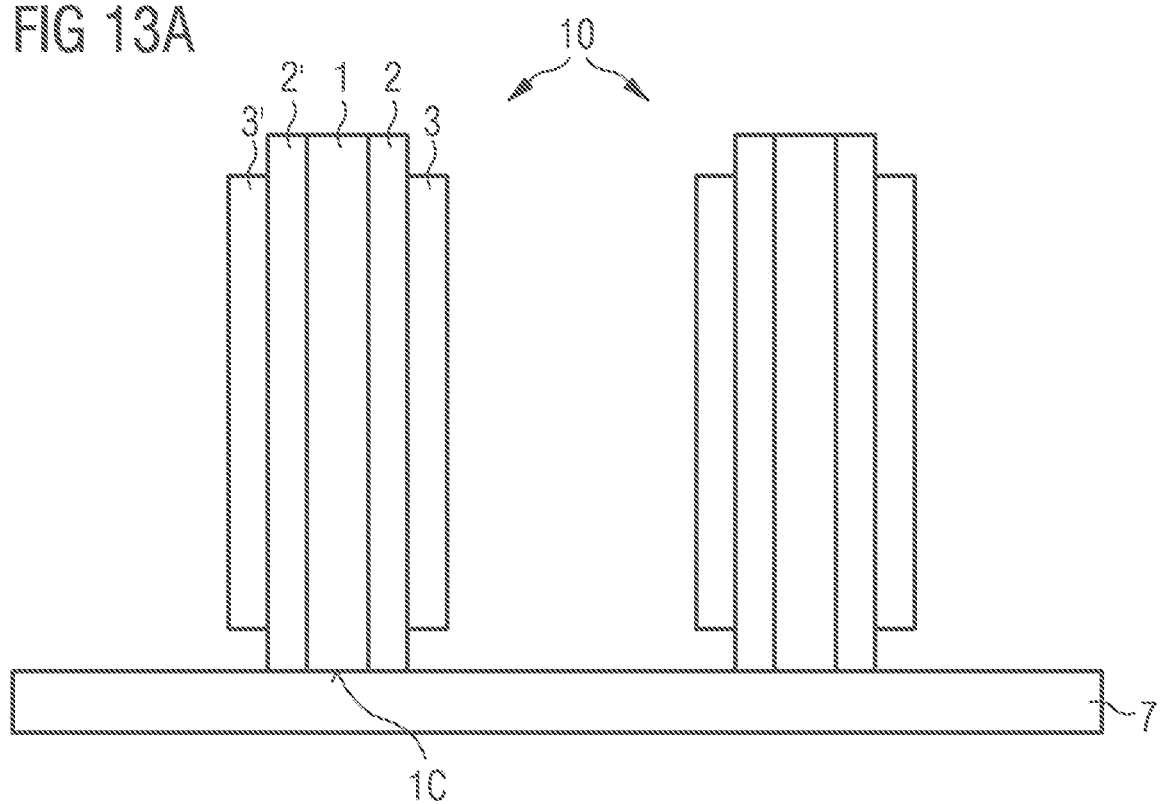

In a first method step, FIG. 13A, the semiconductor chips 10 are attached to a carrier 7, which is, for example, a temporary carrier. The semiconductor chips 10 are attached to the carrier 7 with the first side surface 1C of the substrate.

Figure 13B:
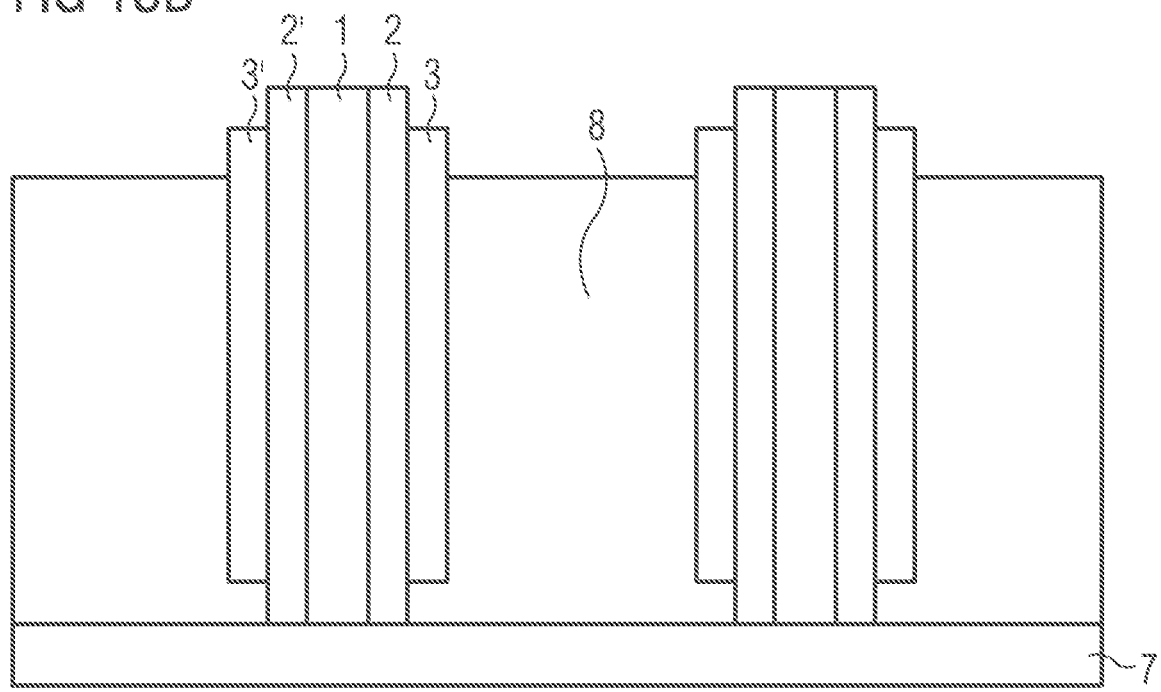

Subsequently, FIG. 13B, the semiconductor chips 10 are cast with the casing 8, which can be, for example, a plastic material such as silicone and/or epoxy resin, into which further particles such as, for example, radiation-diffusing and/or radiation-reflecting and/or radiation-converting particles can be introduced. In this case, an encapsulating with the casing 8 takes place in such a way that the contacting 3, the semiconductor body 2, the substrate 1, the further semiconductor body 2' and the further contact 3' protrude from the casing 8 on the side facing away from the carrier 7.

Figure 13C:
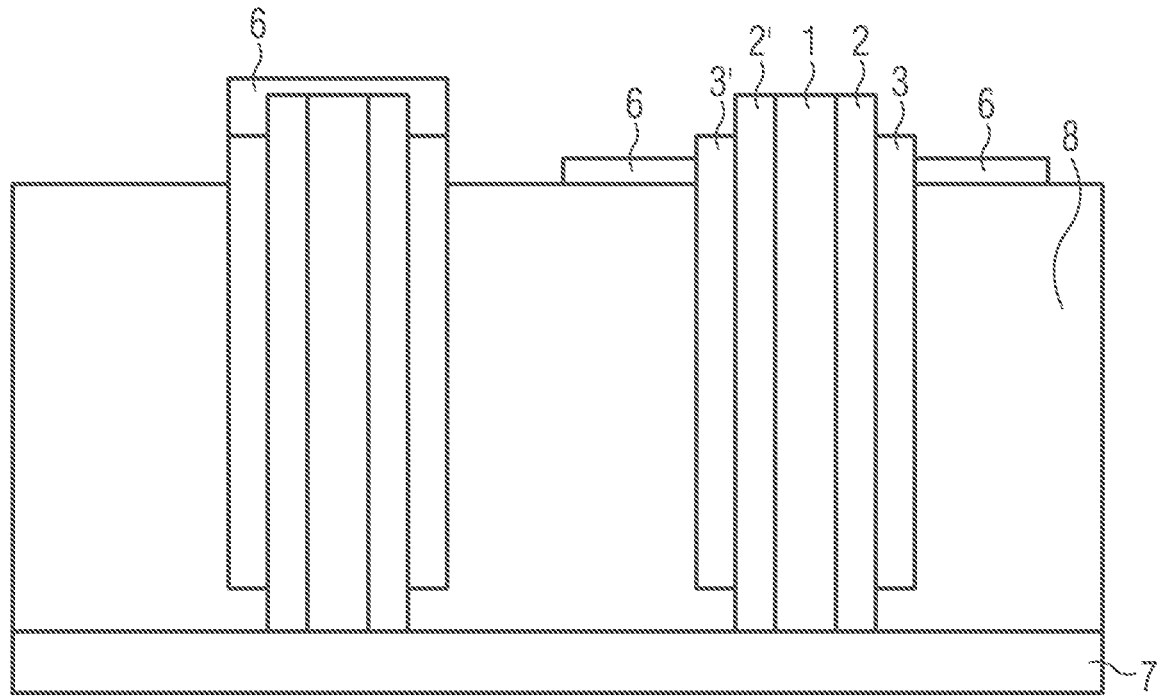

In the next method step, FIG. 13C, a mirror 6 can optionally be structured or arranged over the entire surface. The mirror 6 is, for example, a dielectric mirror, which can be embodied as a Bragg mirror. Alternatively, it is possible that the mirror 6 is formed by a reflecting layer, which comprises, for example, titanium dioxide. For this purpose, particles of titanium dioxide can be introduced, for example, into a silicone matrix.

During the application of the mirror 6, care is taken to ensure that the contact 3 and the further contact 3' comprising the respective current distribution structures remain partially free or exposed.

Figure 13D:
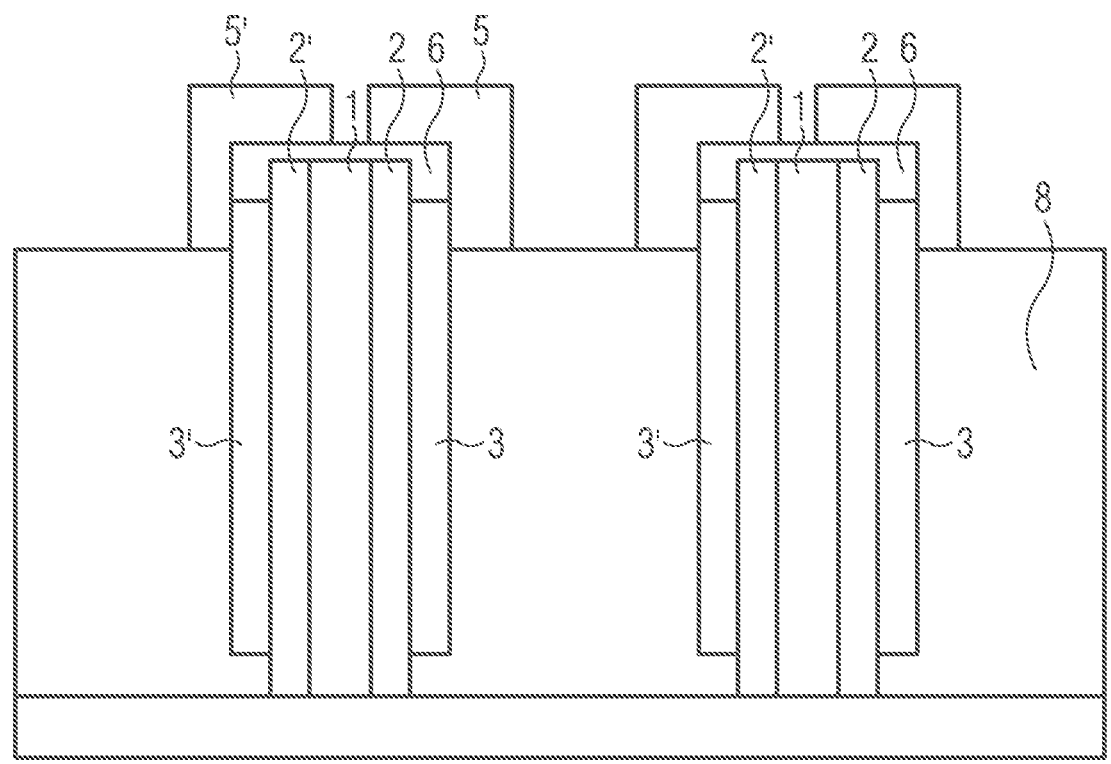

In the next method step, FIG. 13D, the connections 5, 5', that is to say the associated connection elements, are produced, for example, by structured application of a metal.

The connections 5, 5' are applied planar, for example, by laser direct imaging.

In the last method step, FIG. 13E, singulation takes place through the casing 8, as well as a detachment of the carrier 7.

Figure 14A:
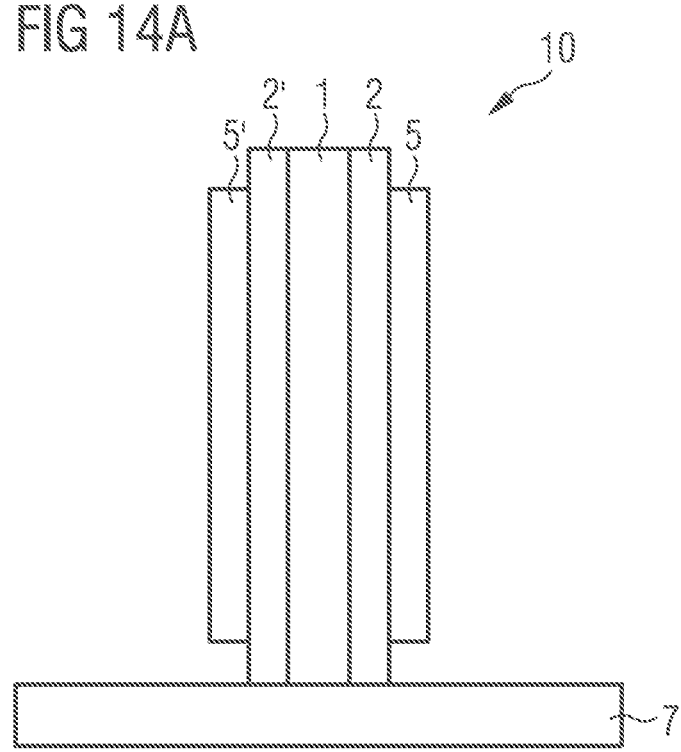
Figure 14B:
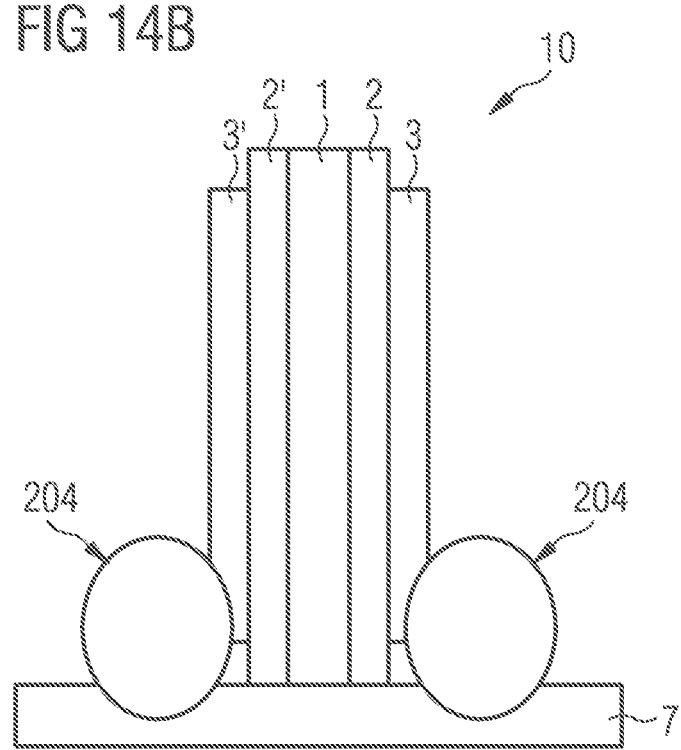

FIGS. 14A and 14B show a schematic sectional representation of a further exemplary embodiment of a method for producing a light-emitting component 100 described here. In this embodiment, initially, the semiconductor chip 10 is attached to a carrier 7, which can, for example, be a circuit board, by adhesive bonding. Subsequently, FIG. 14B, an electrical connection is then made between the carrier 7 and the semiconductor chip 10 by means of a solder material 204, which is formed, for example, by solder balls. This connection can be produced, for example, by means of a solder-jet technology.

Figure 15A:
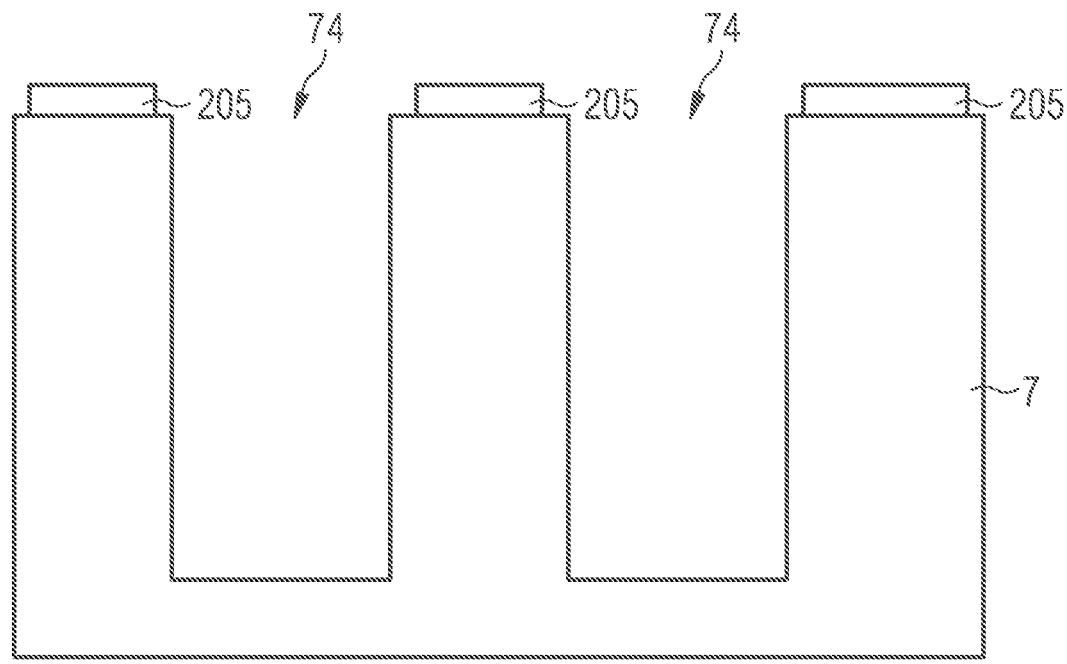
Figure 15B:
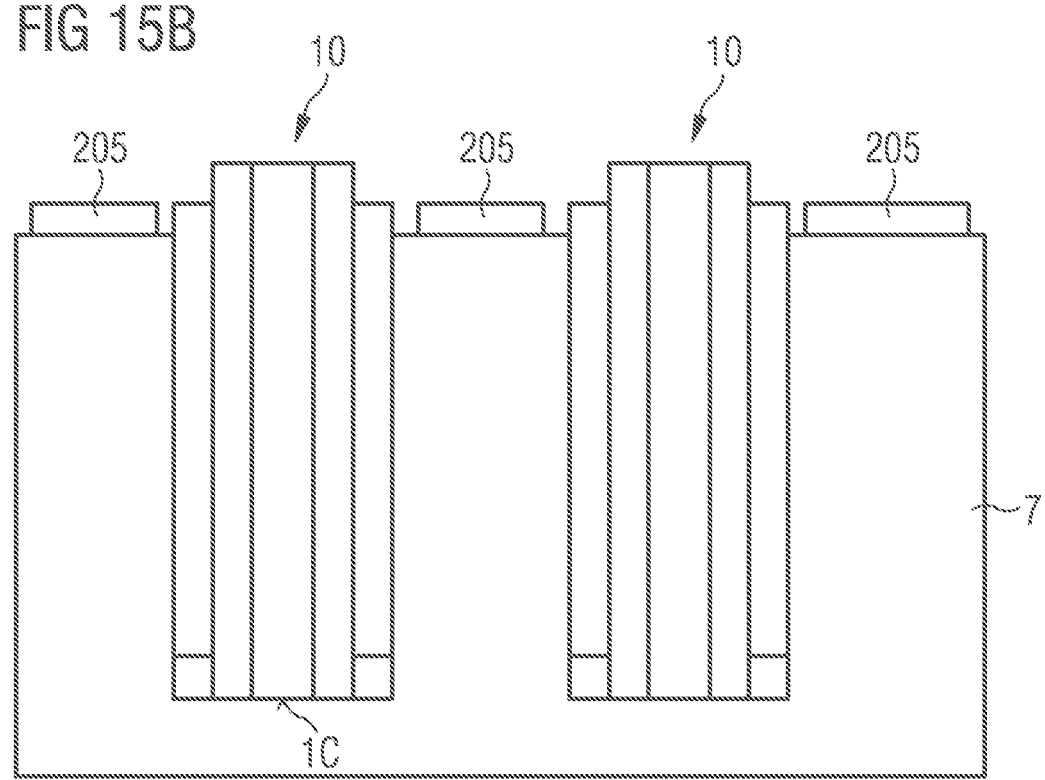
Figure 15C:
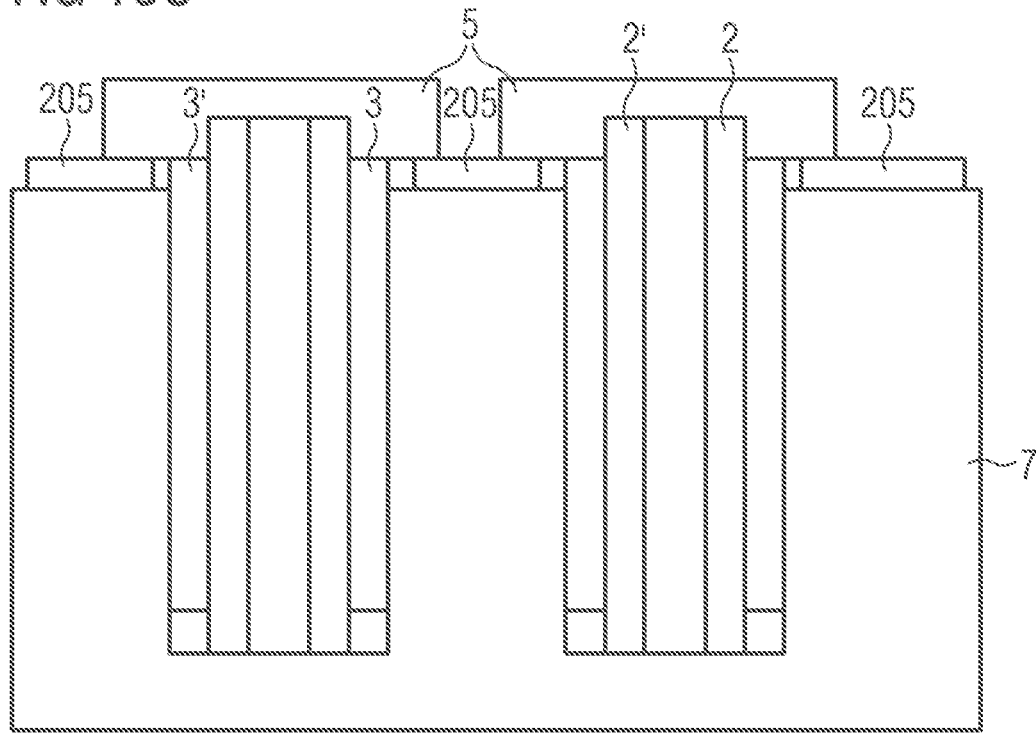

In connection with the schematic sectional representations of FIGS. 15A to 15C, a further exemplary embodiment of a method for producing a light-emitting component 100 described here is described.

In this method, initially a carrier 7 is provided, which has openings 74. The carrier is formed, for example, by a translucent material such as a glass or a plastic. At an upper side of the carrier 7, conductor tracks 205 are formed by an electrically conductive material such as, for example, a metal. In each case one chip 10 is inserted into each of the openings 74 in connection with the method step shown in FIG. 15B, so that the side surface 1c of the substrate 1 of each chip 10 adjoins the carrier 7. There, for example, they can be attached by means of adhesive bonding.

Subsequently, FIG. 15C, the connections 5 can be produced by means of a planar interconnect technology or by means of solder material and a connection to the conductor tracks 205 can be produced. Between the connection 5 and the semiconductor chip 10 an insulation (not shown) can be arranged in the region of the semiconductor bodies 2, 2'. The semiconductor bodies 2, 2' of each semiconductor chip 10 are connected in parallel with one another.

Figure 16A:
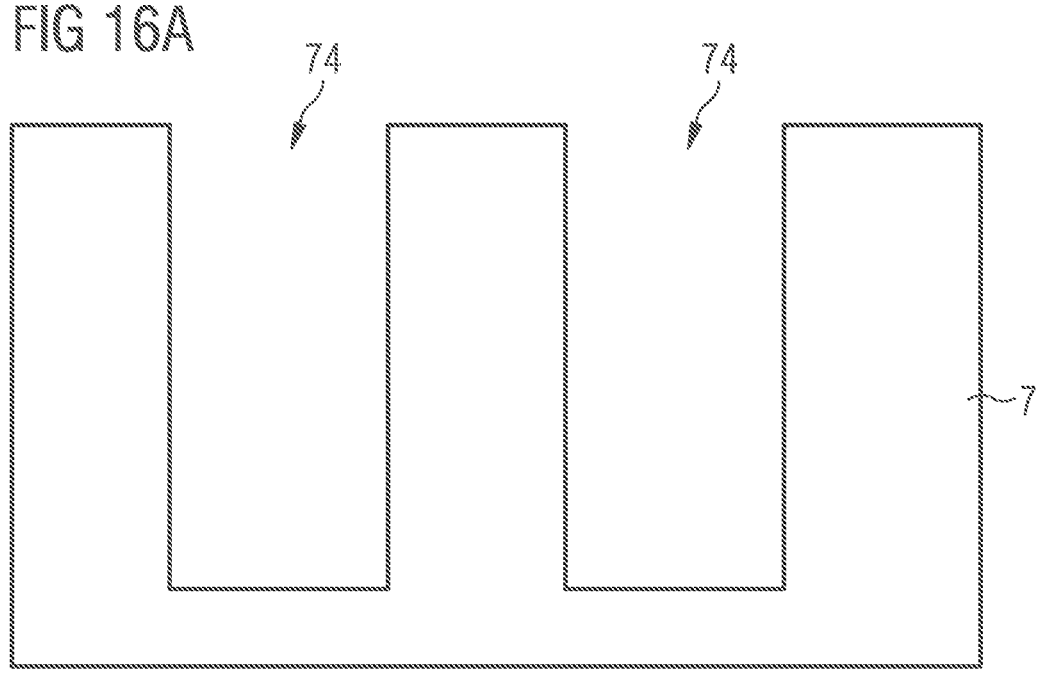

A production method for producing a light-emitting component described here is described in connection with FIGS. 16A to 16C, in which initially a carrier 7 with openings 74 is provided. The carrier 7 is used for temporarily reception semiconductor chips 10 and is therefore not provided with conductor tracks 205.

Figure 16B:
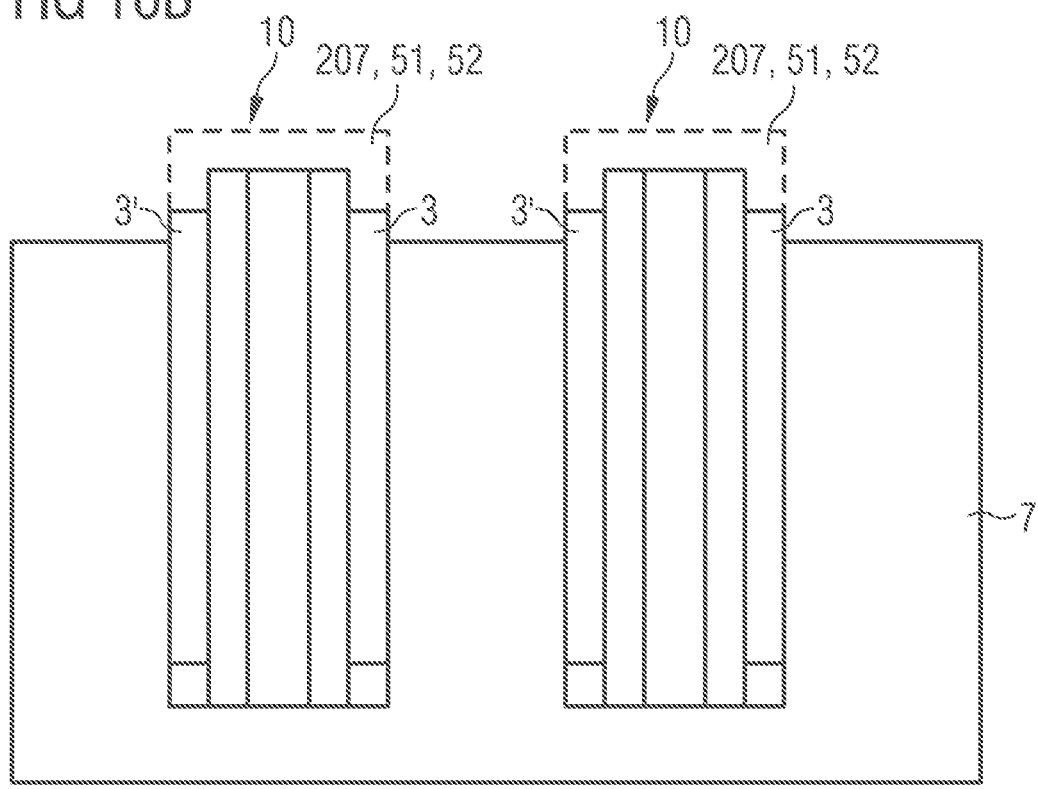
Figure 16C:
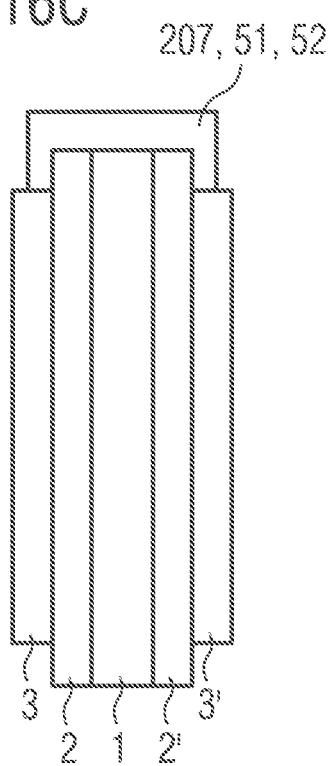

In the openings 74 of the carrier 7, FIG. 16B, the semiconductor chips 10 are inserted and between the contacts 3, 3', an electrically conductive connection 207 is produced, for example, in the form of bonding rods. The connection 207 can be produced, for example, by means of a lithographic method. In this case, the current distribution structures of the contacts 3, 3' are connected to one another in such a way that the semiconductor bodies 2, 2' are connected in parallel to one another.

The connection 207 forms the connection elements 51, 52, i.e., the result is a light-emitting semiconductor chip 10 as shown, for example, in connection with FIG. 10A.

A light-emitting component described here and a light-emitting semiconductor chip described here are particularly suitable for forming luminous means, which can be used, for example, for general illumination. The luminous means can be, in particular, so-called retrofits, which serve to replace conventional lighting means, such as, for example, for replacing incandescent bulbs.

The invention is not restricted to the exemplary embodiments by the description on the basis of the exemplary embodiments. Rather, the invention includes each new feature and each combination of features, which includes in particular each combination of features in the patent claims, even if this feature or this combination itself is not explicitly indicated in the patent claims or exemplary embodiments.

The invention claimed is:

1. A light-emitting semiconductor chip comprising:
   a substrate comprising a top surface, a bottom surface opposite the top surface and a first side surface extending transversely or perpendicularly to the bottom surface;
   a semiconductor body arranged on the top surface of the substrate, the semiconductor body comprising an active region configured to generate light;

a contact comprising a first current distribution structure and a second current distribution structure, which is formed to supply current to the active region a further semiconductor body on the bottom surface of the substrate which comprises a further active region configured to generate light; and a further contact comprising a further first current distribution structure and a further second current distribution structure, which is formed to supply current to the further active region, wherein the light-emitting semiconductor chip is free of any connection point on a side of the semiconductor body facing away from the substrate and on the bottom surface of the substrate, and wherein the connection point is a connection point for electrically contacting the first and second current distribution structures.

2. The light-emitting semiconductor chip according to claim 1, wherein the substrate is light-transmissive.

3. The light-emitting semiconductor chip according to claim 1, wherein the first current distribution structure and the second current distribution structure are freely accessible from a side of the semiconductor body facing away from the substrate.

4. The light-emitting semiconductor chip according to claim 1, wherein the light-emitting semiconductor chip is free of any connection point, and wherein the connection point is a connection point for electrically contacting the first and second current distribution structures.

5. The light-emitting semiconductor chip according to claim 1, wherein the first side surface of the substrate comprises a mounting surface of the light-emitting semiconductor chip.

6. The light-emitting semiconductor chip according to claim 1, further a connection comprising a first connection element and a second connection element, wherein the connection is arranged on the first side surface, which is a mounting surface of the light-emitting semiconductor chip, and wherein the first connection element is electrically conductively connected to the first current distribution structure and the second connection element is electrically conductively connected to the second current distribution structure.

7. The light-emitting semiconductor chip according to claim 1, wherein the further contact is arranged below an outer surface of the further semiconductor body facing away from the substrate.

8. The light-emitting semiconductor chip according to claim 1, wherein the further first current distribution structure and the further second current distribution structure are freely accessible from a side of the further semiconductor body facing away from the substrate.

9. The light-emitting semiconductor chip according to claim 1, wherein the contact is arranged below an outer surface of the semiconductor body facing away from the substrate.

10. The light-emitting semiconductor chip according to claim 1, wherein the substrate further comprises a second side surface, which is arranged transversely or perpendicularly to the first side surface, and wherein the second side surface has a larger surface area than the first side surface.

11. The light-emitting semiconductor chip according to claim 1, further comprising a mirror, wherein the mirror is arranged on the first side surface, which comprises a mounting surface of the light-emitting semiconductor chip.

12. A light-emitting component comprising:
a carrier comprising a carrier body having a top surface and a bottom surface opposite the top surface; and
the light-emitting semiconductor chip according to claim 1.

13. The light-emitting component according to claim 12, wherein the carrier body comprises an opening, the opening penetrating the carrier body from its top surface to its bottom surface,
wherein the light-emitting semiconductor chip is located in the opening,
wherein the first side surface of the substrate of the light-emitting semiconductor chip projects beyond the bottom surface of the carrier body or is flush with the bottom surface of the carrier body or the bottom surface of the carrier body projects beyond the first side surface of the substrate of the light-emitting semiconductor chip, and
wherein a third side surface of the substrate, which is arranged opposite the first side surface of the substrate of the light-emitting semiconductor chip, projects beyond the carrier body on its top surface.

14. The light-emitting component according to claim 12, further comprising a mirror layer, wherein the mirror layer is arranged on the bottom surface and/or the top surface of the carrier body, and wherein the mirror layer covers the bottom surface of the carrier body or the carrier body is configured to be reflective.

15. The light-emitting component according to claim 12, further comprising a connection comprising a first connection element and a second connection element, wherein the connection is arranged on the bottom surface of the carrier body, and wherein the first connection element is electrically conductively connected to the first current distribution structure and the second connection element is electrically conductively connected to the second current distribution structure of the light-emitting semiconductor chip.

16. The light-emitting component according to claim 12, further comprising an electrically insulating passivation layer arranged between the connection and the carrier body.

17. The light-emitting component according to claim 16, wherein the passivation layer covers the first side surface of the substrate in places.

18. A method for producing light-emitting components, the method comprising:
providing a plurality of light-emitting semiconductor chips according to claim 1;
providing a carrier comprising a carrier body having a top surface, a bottom surface opposite the top surface and a plurality of openings penetrating the carrier body from its top surface to its bottom surface;
inserting the light-emitting semiconductor chips into the openings, wherein the light-emitting semiconductor chips are inserted into the openings with the first side surface in front of the top surface in a direction of the bottom surface; and
singulating the carrier with the plurality of light-emitting semiconductor chips to produce the light-emitting components, wherein each light-emitting component comprises at least one of the light-emitting semiconductor chips.

19. The method according to claim 18, further comprising, before singulating, surrounding all the light-emitting semiconductor chips by a casing, which completely surrounds the light-emitting semiconductor chips and which adjoins the top surface of the carrier body between the semiconductor chips, wherein singulating comprises singulating through the casing.

20. The light-emitting semiconductor chip according to claim 1, wherein the first and second current distribution structures have a distance of at least 10 µm from each edge of the semiconductor body.

21. A light-emitting component comprising:
a light-emitting semiconductor chip comprising:
  a substrate comprising a top surface, a bottom surface opposite the top surface and a first side surface extending transversely or perpendicularly to the bottom surface;
  a semiconductor body arranged on the top surface of the substrate, the semiconductor body comprising an active region configured to generate light; and
  a contact comprising a first current distribution structure and a second current distribution structure, which is formed to supply current to the active region,
  wherein the light emitting semiconductor chip is free of any connection point on a side of the semiconductor body facing away from the substrate and on the bottom surface of the substrate, and
  wherein the connection point is a connection point for electrically contacting the first and second current distribution structures; and
a carrier comprising a carrier body having a top surface and a bottom surface opposite the top surface,
wherein the carrier body comprises an opening, the opening penetrating the carrier body from its top surface to its bottom surface,
wherein the light-emitting semiconductor chip is located in the opening,
wherein the first side surface of the substrate of the light-emitting semiconductor chip projects beyond the bottom surface of the carrier body or is flush with the bottom surface of the carrier body or the bottom surface of the carrier body projects beyond the first side surface of the substrate of the light-emitting semiconductor chip, and
wherein a third side surface of the substrate, which is arranged opposite the first side surface of the substrate of the light-emitting semiconductor chip, projects beyond the carrier body on its top surface.

22. A method for producing light-emitting components, the method comprising:
providing a plurality of light-emitting semiconductor chips comprising:
  a substrate comprising a top surface, a bottom surface opposite the top surface and a first side surface extending transversely or perpendicularly to the bottom surface;
  a semiconductor body arranged on the top surface of the substrate, the semiconductor body comprising an active region configured to generate light; and
  a contact comprising a first current distribution structure and a second current distribution structure, which is formed to supply current to the active region,
  wherein the light emitting semiconductor chip is free of any connection point on a side of the semiconductor body facing away from the substrate and on the bottom surface of the substrate, and
  wherein the connection point is a connection point for electrically contacting the first and second current distribution structures;
providing a carrier comprising a carrier body having a top surface, a bottom surface opposite the top surface and a plurality of openings penetrating the carrier body from its top surface to its bottom surface;
inserting the light-emitting semiconductor chips into the openings, wherein the light-emitting semiconductor chips are inserted into the openings with the first side surface in front of the top surface in a direction of the bottom surface; and
singulating the carrier with the plurality of light-emitting semiconductor chips to produce the light-emitting components, wherein each light-emitting component comprises at least one of the light-emitting semiconductor chips.

23. The method according to claim 22, further comprising, before singulating, surrounding all the light-emitting semiconductor chips by a casing, which completely surrounds the light-emitting semiconductor chips and which adjoins the top surface of the carrier body between the semiconductor chips, wherein singulating comprises singulating through the casing.

* * * * *